(12) United States Patent
Sakata

(10) Patent No.: US 6,383,829 B1
(45) Date of Patent: May 7, 2002

(54) OPTICAL SEMICONDUCTOR DEVICE AND METHOD OF FABRICATING THE SAME

(75) Inventor: Yasutaka Sakata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/667,524

(22) Filed: Sep. 22, 2000

Related U.S. Application Data

(62) Division of application No. 08/986,249, filed on Dec. 5, 1997, now Pat. No. 6,167,070.

(30) Foreign Application Priority Data

Dec. 5, 1996 (JP) .............................. 8-325370

(51) Int. Cl.$^7$ .............................. H01L 21/00
(52) U.S. Cl. .............................. 438/31; 438/65; 257/9; 257/14
(58) Field of Search .................. 438/31, 65; 257/9.14; 372/45; 65/406

(56) References Cited

U.S. PATENT DOCUMENTS

| | | | | |
|---|---|---|---|---|
| 5,574,298 A | * | 11/1996 | Aoki et al. .................. | 257/17 |
| 5,790,580 A | * | 8/1998 | Sakata et al. ................. | 372/50 |
| 5,889,294 A | | 3/1999 | Kashima et al. .............. | 257/80 |
| 5,910,012 A | * | 6/1999 | Takeuchi ..................... | 438/31 |
| 5,933,562 A | * | 8/1999 | Dutting et al. ............... | 385/131 |
| 5,987,046 A | | 11/1999 | Kobayashi et al. ........... | 372/45 |
| 6,037,189 A | * | 9/2000 | Goto .......................... | 438/31 |
| 6,181,722 B1 | * | 1/2001 | Dutting et al. ............... | 372/45 |
| 6,238,943 B1 | * | 5/2001 | Kobayashi et al. ........... | 438/31 |

FOREIGN PATENT DOCUMENTS

| | | |
|---|---|---|
| EP | 0720243 | 7/1996 |
| EP | 0772268 | 5/1997 |
| JP | 285804 | 3/1990 |
| JP | 7135372 | 5/1995 |
| JP | 7202334 | 8/1995 |
| JP | 8139417 | 5/1996 |
| JP | 8236465 | 9/1996 |
| JP | 8288583 | 11/1996 |
| JP | 8292336 | 11/1996 |
| JP | 8330673 | 12/1996 |
| JP | 10098231 | 4/1998 |

OTHER PUBLICATIONS

Terakado et al.; "Submilliamp thershold 1.3/ spl mu/m strained MQW lasers with novel p– substrate buried–heterostructure grown by MOVPE using TBA and TBP"; pp. 2182–2184; Dec. 7, 1995; Electronics Letters.*

Sakata et al. "Selective MOVPE growth of InGaAsP and InGaAs using TBA and TBP"; May 9–13, 1995; pp. 839–842; Seventh International Conference on Indium Phosphide and Related Materials 1995.*

Electronics Letters, vol. 31, No. 13, Jun. 22, 1995, pp. 1069–1070.

(List continued on next page.)

Primary Examiner—Wael Fahmy
Assistant Examiner—Fernando Toledo
(74) Attorney, Agent, or Firm—Young & Thompson

(57) ABSTRACT

There is provided an optical semiconductor device including an optical waveguide structure having a quantum well layer and an optical confinement layer as a core layer, wherein the core layer has a thickness varying in a lengthwise direction of the optical waveguide to thereby have a function of spot-size conversion, and the quantum well layer is designed to have a band-gap energy which is constant within ±30 meV in the direction. The above-mentioned optical semiconductor device makes it possible to an optical gain to laser oscillation wavelength over all ranges of a resonator, and hence makes it no longer necessary to form a region only for spot-size conversion (SSC). This ensures that a device length can be as small as that of a conventional laser diode. In addition, lower threshold value characteristic and high temperature operation performance could be achieved, and a yield in devices per a wafer can be significantly enhanced.

18 Claims, 25 Drawing Sheets

OTHER PUBLICATIONS

Electronics Letters, vol. 31, No. 25, Dec. 7,1995, pp. 2178–2179.

Electronics Letters, vol. 31, No. 24, Nov. 23, 1995, pp. 2102–2104.

Extended Abstracts (The 56$^{th}$ Autumn Meeting 1995), 28a–ZF–6, No. 1, pp. 293.

Extended Abstracts (The 39$^{th}$ Spring Meeting 1992), 30a–SF–29, No. 3, pp. 976.

Journal of Electronic Materials, vol. 25, No. 3, 1996, pp. 401–406.

Tatsuya Sasaki et al., "Monolithically integrated multiwavelength MQW–DBR laser diodes fabricated by selective metalorganic vapor phase epitaxy," Journal of Crystal Growth, vol. 145, 1994, pp. 846–851.

T. Yamamoto et al., "High temperature operation of 1.3 $\mu$m narrow beam divergence tapered–thickness waveguide BH MQW lasers," p. 2178, Electronics Letters, GB, IEE Stevenage, vol. 31, No. 25, Dec. 7, 1995.

* cited by examiner

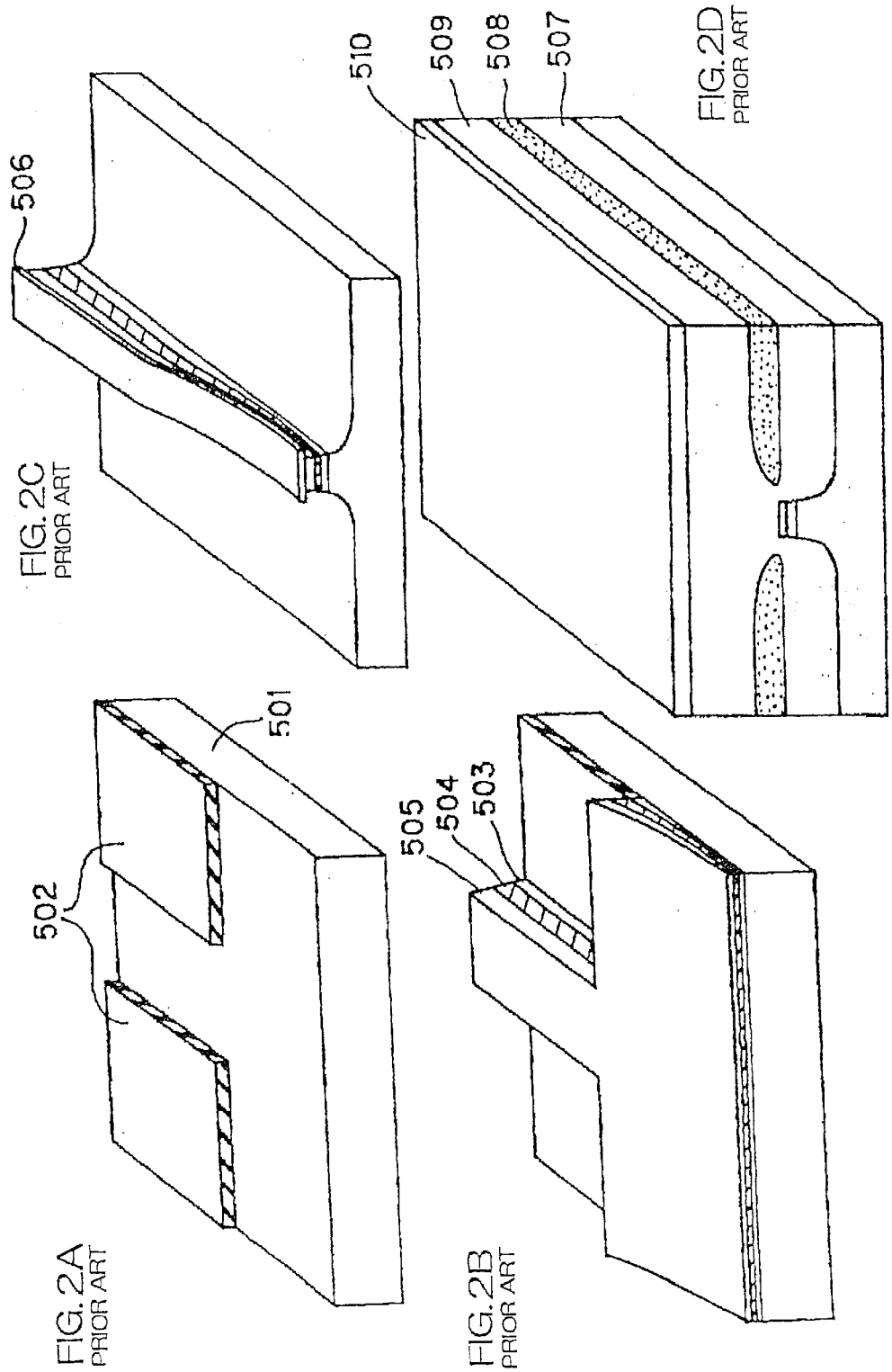

OPTICAL SEMICONDUCTOR DEVICE AND METHOD OF FABRICATING THE SAME

This application is a divisional of co-pending application Ser. No. 08/986,249, filed on Dec. 5, 1997 now U.S. Pat. No. 6,067,070, the entire contents of which are hereby incorporated by reference.

BACKGROUND OF THE INVENTION

1. Field of the Invention

The invention relates to an optical semiconductor device and a method of fabricating the same, and more particularly to a waveguide type optical semiconductor device having a function of spot-size conversion and a method of fabricating the same.

2. Description of the Related Art

With the recent development of an optical access system typical of "fiber to the home (FTTH)", a semiconductor laser module used for optical communication is desirable fabricated at a lower cost.

One of major factors for keeping a fabrication cost of a semiconductor laser module high is a packaging cost necessary for optically coupling a laser diode to an optical fiber. Hence, an attention has been recently paid to a spot-size converted semiconductor laser diode which readily accomplishes higher optical coupling between a laser diode and an optical fiber. Herein, a spot-size converted semiconductor laser diode (SSC-LD) is a laser diode which enlarges a spot-size at a plane through which a laser beam leaves, to thereby keep a beam divergence angle small. A smaller beam divergence angle would reduce lights radiated into a free space to thereby ensure a higher optical coupling efficiency for optically coupling a laser diode to an optical fiber. In other words, provision of a semiconductor laser diode with a function of a lens would make it no longer necessary for a semiconductor laser diode to have an optical lens system which was absolutely necessary for a conventional semiconductor laser module. Thus, A semiconductor laser module could be fabricated at lower costs.

In order to enlarge a spot-size at a plane at which laser beams leave a laser diode, it would be necessary to make an optical confinement factor small at the above-mentioned plane in an optical waveguide to thereby enlarge an optical field. Specifically, an optical waveguide is designed to include a spot-size converting portion having a thickness smaller than other portions. A spot-size conversion (SSC) structure like this is useful for all of waveguide type optical semiconductor devices such as a an optical semiconductor modulator, an optical semiconductor amplifier and a waveguide pin photo diode as well as a semiconductor laser diode.

For instance, one of SSC-LDs has been suggested by Y. Tohmori et al. in ELECTRONICS LETTERS, Jun. 22nd, 1995, Vol. 31, No. 13, pp. 1069–1070 (hereinafter, referred to as first prior art). FIGS. 1A to 1E are cross-sectional views of a laser diode showing respective steps of a method of fabricating a laser diode in accordance with the first prior art.

As illustrated in FIG. 1A, a laser active layer is formed on an InP substrate 401. The laser active layer comprises a first separate confinement hetero-structure (SCH) layer 402, a strained multi-quantum well (MQW) structure 403, and a second SCH layer 404, and each of them are successively epitaxially grown by metal-organic vapor phase epitaxy (hereinafter, referred to simply as MOVPE) growth method.

Then, a SiNx layer 405 is formed on the laser active layer. Then, a portion which would make an SSC portion is etched until the InP substrate 401 appears with the SiNx layer 405 used as a mask. Then, as illustrated in FIG. 1B, an SSC structure comprising a 1.1 μm-bandgap wavelength InGaAsP layer 406 is selectively grown to thereby form a butt-joint.

Then, the SiNx layer 405 is removed, followed by growth of a p-InP clad layer 407 and a p-cap layer 408 all over the product, as illustrated in FIG. 1C.

Then, an SiNx stripe mask 409 is formed partially on the p-cap layer 408, and thereafter the product is etched until a certain depth of the InP substrate 401 with the SiNx stripe mask 409 used as a mask to thereby form a high-mesa structure, as illustrated in FIG. 1D.

Then, the SiNx stripe mask 409 is removed only in the SSC portion, followed by growth of a Fe-doped highly resistive InP layer 410, as illustrated in FIG. 1E. The thus fabricated laser diode has a 300 μm-long laser active layer region and a 300 μm-long SSC region.

In the above-mentioned method of fabricating a laser diode in accordance with the first prior art, it is necessary to repeatedly carry out complicated steps of selective etching and selective re-growth, and it is also necessary to complete a waveguide by forming a butt-joint. Thus, the first prior art has a problem that it is difficult to fabricate a laser diode with a high fabrication yield.

Another example of SSC-LD has been suggested by T. Yamamoto in ELECTRONICS LETTERS, Dec. 7th, 1995, Vol. 31, No. 25, pp. 2178–2179 (hereinafter, referred to as second prior art), wherein a multi-quantum well (MQW) structure having different thicknesses and band-gap energies between a laser active layer region and an SSC region is formed by a single selective growth. Hereinbelow is explained the second prior art with reference to FIGS. 2A to 2D.

First, a pair of dielectric masks 502 having a width in the range of tens of micrometers to multi-hundreds of micrometers is formed on an n-InP substrate 501 with the masks 502 being spaced away from each other by 10–20 μm, as illustrated in FIG. 2A.

Then, an n-InP clad layer 503, a strained MQW structure 504, and a p-InP clad layer 505 are selectively grown on the n-InP substrate 501 by MOVPE, as illustrated in FIG. 2B. In this selective growth of the layers 503, 505 and the structure 504, enhancement in a growth rate and increase in an In incorporation rate occur in a region sandwiched between the masks 502 due to vapor phase lateral diffusion of source materials. As a result, a thickness of MQW is enhanced and further a band-gap wavelength is made longer in the region sandwiched between the masks 502 in comparison with other region not sandwiched between the masks 502. Accordingly, the region sandwiched between the masks 502 makes a laser active layer, and the other region not sandwiched between the masks 502 makes an SSC region.

Then, after removal of the dielectric masks 502, a dielectric stripe mask 506 is formed over the selectively grown layers. Thereafter, the product is mesa-etched so that the laser active layer has a width of 1.2 μm, as illustrated in FIG. 2C.

Then, a p-InP current block layer 507 and an n-InP current block layer 508 are grown all over the product. Then, after removal of the dielectric stripe mask 506, a p-InP second clad layer 509 and a cap layer 510 are grown over the n-InP current block layer 508, as illustrated in FIG. 2D. The thus formed laser active layer region is 300 μm long, and the SSC region is 200 μm long.

Still another example of a laser diode has been suggested by M. Wada et al. in ELECTRONICS LETTERS, Nov. 23rd, 1995, Vol. 31, No. 24, pp. 2102–2104. There has been suggested laser diodes monolithically integrated with spot-size converters operating at 1.3 µm and having an almost circular far-field pattern and a −1.3 dB butt-coupling-loss-to-fiber with wide alignment tolerance. However, the overall device length is 450 µm.

In the above-mentioned first and second prior art, the SSC regions do not have an optical gain, because they are formed merely for enlarging a spot of laser oscillation lights. Accordingly, the first and second prior art are inferior to an ordinary semiconductor laser diode having no SSC region with respect to increasing of a threshold current and degrading performance at high temperature, because the SSC region causes optical losses.

In addition, a device yield per a unit area or per a wafer would be reduced in the above-mentioned conventional SSC-LDs, because they have to be fabricated longer by a length of the SSC region. Specifically, the laser diode in accordance with the first prior art includes the 300 µm long laser active layer region and the 300 µm long SSC region, and hence is totally 600 µm long. The laser diode in accordance with the second prior art includes the 300 µm long laser active layer region and the 200 µm long SSC region, and hence is totally 500 µm long. An ordinary laser diode having no SSC region is 300 µm long. Thus, a yield per a wafer for fabricating devices is reduced by about 40–50% in the first and second prior art in comparison with the conventional laser diodes.

Moreover, the first prior art requires to carry out complicated fabrication steps of repeated selective etching of semiconductor layers and selective re-growth. In addition, since a butt-joint having a problem in repeatability is introduced into a waveguide, the first prior art has a problem in controllability and repeatability, resulting in difficulty in fabricating a semiconductor diode with a high yield and with high repeatability.

Since the second prior art employs mesa-etching/re-growth steps of semiconductor layers for forming an optical waveguide, the second prior art has the same problem as that of the first prior art. Namely, the second prior art has a problem in controllability and repeatability, resulting in difficulty in fabricating a semiconductor diode with a high yield and with high repeatability.

SUMMARY OF THE INVENTION

In view of the foregoing problems of the prior art, it is an object of the present invention to provide an optical semiconductor device capable of having an optical gain to laser oscillation wavelengths to thereby eliminate optical losses in an SSC region without being fabricated longer than a conventional optical semiconductor device, and also capable of achieving a lower threshold value characteristic and high temperature performance with a higher yield per a wafer.

In one aspect, there is provided an optical semiconductor device including an optical waveguide structure having a quantum well layer and an optical confinement layer as a core layer, the core layer having a thickness varying in a lengthwise direction of the optical waveguide to thereby have a function of spot-size conversion, the quantum well layer being designed to have a band-gap energy which is constant within ±30 meV in the direction.

There is further provided an optical semiconductor device including an optical waveguide structure having a quantum well layer and an optical confinement layer as a core layer, the core layer having a thickness varying in a lengthwise direction of the optical waveguide to thereby have a function of spot-size conversion, the quantum well layer being designed to have a thickness which is constant within ±32% in the direction.

It is preferable that the quantum well layer has a constant thickness and the optical confinement layer has a thickness varying in the direction, in which the optical confinement layer may have a thickness gradually reducing toward an end thereof through which a light leaves the optical confinement layer. It is preferable that the optical confinement layer has a first thickness smaller than that of the quantum well layer at the end thereof, but has a second thickness greater than that of the quantum well layer at the other end thereof, in which case a ratio of the second thickness to the first thickness is preferably equal to or greater than 2.

It is preferable that the quantum well layer has a constant thickness in the direction, and the optical confinement layer has a thickness which is maximum at the center in the direction.

The optical semiconductor device may serve as a semiconductor laser diode or an optical amplifier having the above-mentioned core layer as an active layer, in which case optical gain is obtained in the direction. As an alternative, the optical semiconductor device may serve as a electro-absorption type optical modulator or a waveguide type pin photo-diode, in which case the core layer may serve as an optical-absorption layer in the direction.

As mentioned earlier, the optical semiconductor device in accordance with the present invention has a quantum well structure in the core layer, and has a band-gap substantially constant in a lengthwise direction of the waveguide. Specifically, in a certain embodiment, the well layer has a thickness constant in the lengthwise direction of the waveguide, and the optical confinement and/or barrier layers have a thickness varying in the direction. Hereinbelow, an allowable range in which the band-gap and the thickness of the well layer may vary is explained with reference to FIGS. 3 and 4.

FIG. 3 shows an optical gain spectrum obtained when carriers of $1.50 \times 10^{18}$ cm$^{-3}$ are introduced into a 1.3 µm-band quantum well semiconductor laser. An optical gain coefficient is positive when a photon energy (a photon wavelength is 1.30 µm) is equal to 950 meV±30 meV. That is, an optical gain can be obtained when photon energy is in the range of 920 meV to 980 meV.

FIG. 4 illustrates a relation between a band-gap wavelength and a thickness of a well layer in a quantum well structure. A range of a well layer thickness allowing ±30 meV tolerance around the band-gap wavelength of 1.30 µm is a range of 3.7 nm to 7.2 nm, namely 5.45 nm +32%. Thus, the band-gap is necessary to be constant with ±30 meV tolerance, and the well layer thickness is necessary to be constant with ±32% tolerance.

In another aspect of the present invention, there is provided a method of fabricating an optical semiconductor device including an optical waveguide having a thickness varying in a lengthwise direction thereof, including the steps of (a) forming a pair of dielectric masks on a compound semiconductor substrate, the masks including a portion where a width thereof varies in the direction, (b) epitaxially growing a lower optical confinement layer by metal-organic vapor phase epitaxy (MOVPE) selective growth, (c) forming a quantum well structure by epitaxially growing a quantum well layer or a plurality of quantum well layers with barrier layers sandwiched between the quantum well layers by metal-organic vapor phase epitaxy (MOVPE) selective growth, and (d) epitaxially growing an upper optical confinement layer by metal-organic vapor phase epitaxy (MOVPE) selective growth, the quantum well layer(s) being grown in the step (c) under a growth pressure lower than that of the lower and upper optical confinement layers in the steps (b) and (d).

It is preferable that the barrier layers are grown in the step (c) under a growth pressure equal to or greater than that of the quantum well layers. The barrier layers are grown in the step (c) under a pressure preferably equal to or greater than 100 hPa, more preferably 200 hPa.

The quantum well layer(s) is(are) grown in the step (c) under a growth pressure preferably equal to or smaller than 40 hPa, more preferably 30 hPa.

The lower and upper optical confinement layers are grown in the steps (b) and (d) under a growth pressure preferably equal to or greater than 100 hPa, more preferably 200 hPa.

There is further provided a method of fabricating an optical semiconductor device including an optical waveguide having a thickness varying in a lengthwise direction thereof, including the steps of (a) forming a pair of dielectric masks on a compound semiconductor substrate, the masks including a portion where a width thereof varies in the direction, (b) epitaxially growing a lower optical confinement layer by metal-organic vapor phase epitaxy (MOVPE) selective growth, (c) forming a quantum well structure by epitaxially growing a quantum well layer or a plurality of quantum well layers with barrier layers sandwiched between the quantum well layers by metal-organic vapor phase epitaxy (MOVPE) selective growth, and (d) epitaxially growing an upper optical confinement layer by metal-organic vapor phase epitaxy (MOVPE) selective growth, the quantum well layer(s) being grown in the step (c) employing tertiarybutylarsine (TBA) and tertiarybutylphosphine (TBP) having a V/III ratio equal to or greater than 50.

It is preferable that the lower and upper optical confinement layers are grown in the steps (b) and (d) employing arsine and phosphine as group V source materials, or employing tertiarybutylarsine (TBA) and tertiarybutylphosphine (TBP) having a V/III ratio equal to or smaller than 5. It is also preferable that the barrier layers are grown in the step (c) employing arsine and phosphine as group V source materials, or employing tertiarybutylarsine (TBA) and tertiarybutylphosphine (TBP) having a V/III ratio equal to or smaller than 5.

FIG. 5 illustrates a mask pattern for MOVPE selective growth. Hereinafter, the principle of the present invention is explained with reference to FIG. 5. A pair of stripe masks 12 is formed on an InP substrate 11 having a (100) plane as a principal plane so that a gap formed between the masks 12 is oriented in the [011] direction. Each of the masks 12 has a width of Wm, and the masks 12 are spaced away from each other by a distance Wg=1.5 μm. A selective growth layer 13 is formed by MOVPE selective growth in an area indicated with Wg and formed between the masks 12.

It is known to those skilled in the art that if the mask width Wm were increased, a thickness or a growth rate of the selective growth layer 13 would be increased, and as a result, In composition would be increased in the case that the selective growth layer 13 is formed of InGaAs or InGaAsP. Hereinbelow are explained the dependency of a growth rate and composition of a selective growth layer on a mask width to be used for selective growth, and the dependency of the same on growth conditions.

There are two mechanisms for an increase in a growth rate, The first one is that source materials supplied onto a mask reach a growth region by surface-migration on a mask, and as a result, a growth rate is increased and becomes greater than a growth rate in the case of non-selective growth, namely growth in unmasked region. The second one is vapor phase lateral diffusion of source materials caused by a concentration gradient produced in vapor phase. Specifically, source materials are consumed in growth region, whereas source materials are not consumed in a mask region. As a result, a concentration gradient is produced in vapor phase. The concentration gradient causes vapor phase lateral diffusion from the mask region to the growth region, and hence a growth rate is increased beyond a growth rate in the case of non-selective growth.

Among the above-mentioned two mechanisms, the second one, namely vapor phase lateral diffusion is predominant. Accordingly, when a quantum well structure is to be formed by selective growth, a well layer would have a greater width with an increase in the mask width Wm, and thus the quantum well structure would have a smaller band-gap or a longer band-gap wavelength.

A compositional change occurs mainly due to a change in a crystal composition of group III source materials such as In and Ga in InGaAsP family materials. A change in a crystal composition is explained as follows. As earlier explained, selective growth occurs due to vapor phase lateral diffusion of source materials. In the vapor phase lateral diffusion, since a decomposition rate or a diffusion rate is different between In and Ga source materials, a concentration ratio between In and Ga varies during vapor phase from a mask region to a growth region. Accordingly, if a mask width were changed, a concentration ratio between In and Ga to be supplied to a growth region varies. Hence, when a quantum well structure including a well layer made of InGaAsP is grown, compressive strain is introduced into the quantum well structure due to an increase in a concentration ratio of In, and resultingly, the quantum well structure would have a smaller band-gap.

As discussed above, since a growth rate and composition of a quantum well structure varies in dependence on a mask width, a multi-quantum well structure having different thicknesses and band-gaps may be formed by common epitaxial growth by selectively growing a multi-quantum well structure made of InGaAsP family material with masks having widths which are different when measured in a stripe direction.

FIG. 6 illustrates curves showing the dependency of a growth-rate increasing rate on a mask width in MOVPE selective growth. The illustrated curves were obtained by the experiments the inventor had conducted using a growth pressure as a parameter. A growth-rate increasing rate is greater under a higher growth pressure. This phenomenon has been reported by the following persons.

(a) K. Tanabe et al., "Growth Pressure Dependence of MOVPE Selective Growth", Extended Abstracts of the 39th Spring Meeting 1992, The Japan Society of Applied Physics and Related Societies, 30a-SF-29, No. 3, pp. 976.

(b) Sasaki et al., Journal of Crystal Growth, Vol. 145, 1994, pp. 846–851

(c) T. Fujii, "Growth rate enhancement in selective area MOVPE based on vapor phase diffusion model", Extended Abstracts of the 56th Autumn Meeting 1995, The Japan Society of Applied Physics, 28a-ZF-6, No. 1, pp. 293.

If a growth pressure were lowered, the dependency of a growth rate on a mask width as well as the dependency of a compositional change on a mask width is weakened, and as a result, a compositional change caused by a mask width, or a band-gap change caused by a mask width is made smaller.

FIG. 7 illustrates curves showing the dependency of a growth rate increasing rate on a mask width in MOVPE selective growth. The illustrated curves were obtained by the experiments the inventor conducted using group V source materials and a V/III ratio as parameters. When arsine and phosphine, V/III ratios of which are in the range of 20 to 1000, are employed as group V source materials, or when tertiarybutylarsine (hereinafter, referred to simply as "TBA") and tertiarybutylphosphine (hereinafter, referred to simply as "TBP") both having a small V/III ratio such as a V/III ratio=5 are employed, a growth rate increasing rate becomes greater. In contrast, when TBA and TBP having a great V/III ratio such as a V/III=100 or greater are employed, the dependency of a growth rate on a mask width is weakened. The similar results have been reported by Y Sakata et al., "Selective MOVPE Growth of InGaAsP and InGaAs Using TBA and TBP", Journal of Electronic Materials, Vol. 25, No. 3, 1996, pp. 401–406.

When TBA and TBP having a great V/III ratio are used in MOVPE selective growth, the dependency of a growth rate on a mask width and further the dependency of a compositional change on a mask width are weakened. As a result, a compositional change caused by a change of a mask width, or a change in a band-gap caused by a change of a mask width is made smaller.

The problems accompanied with the conventional SSC-LDs can be solved by utilizing the above-mentioned the dependency of a growth rate and the dependency of group V source materials in MOVPE selective growth. Specifically, in a step of simultaneously forming a multi-quantum well layer and an SSC region in SSC-LD by MOVPE selective growth, a multi-quantum well layer is grown under a condition where a growth rate increasing rate is small, for instance, under a condition where a growth pressure is equal to or lower than 30 hPa, or TBA and TBP having a V/III ratio equal to 100 are used, whereas an SCH layer or a barrier layer is grown under a condition where a growth-rate increasing rate is great, for instance, under a condition where a growth pressure is equal to or higher than 200 hPa, or TBA and TBP having a V/III ratio equal to or smaller than 5 are used. This ensures a film thickness difference necessary for spot-size conversion with an almost constant band-gap all over a resonator.

This structure ensures an optical gain to a laser oscillation wavelength in overall range of a resonator, resulting in elimination of optical loss in an SSC region similarly to the conventional SSC-LDs. In addition, it is no longer necessary to form a region only for spot-size conversion, which ensures that a device length can be shortened equal to a length of a conventional semiconductor laser. Accordingly, a lower threshold current and a high temperature operation characteristic can be achieved, and a yield per a unit area or per a wafer can be significantly enhanced.

The above-mentioned structure and method of fabricating the same may be applied to an optical semiconductor modulator with SSC function (SSC-modulator), an optical semiconductor amplifier (SSC-amplifier), and a waveguide type pin photo-diode (SSC-pin-PD).

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 2A to 2D are perspective views of a semiconductor laser diode in accordance with the second prior art, showing respective step of a method of fabricating the same.

DESCRIPTION OF THE PREFERRED EMBODIMENTS

[First Embodiment]

Figure 1A:
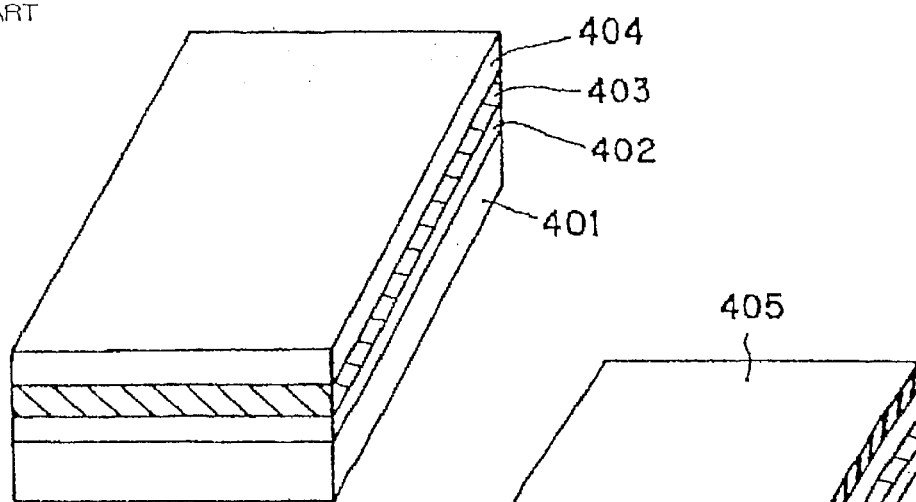
FIGS. 1A to 1E are perspective views of a semiconductor laser diode in accordance with the first prior art, showing respective step of a method of fabricating the same.
Figure 1B:
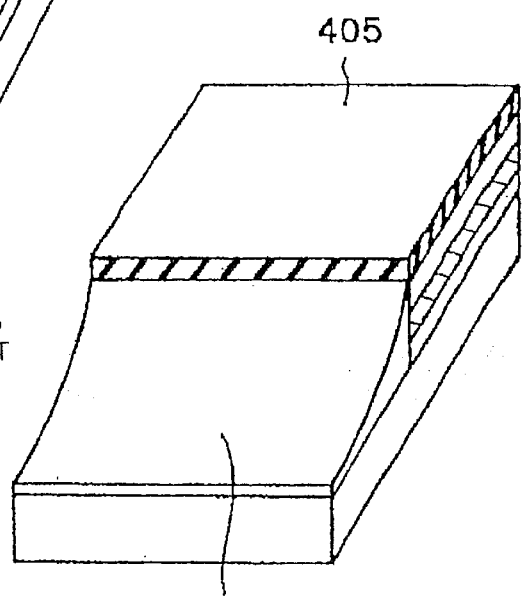
Figure 1C:
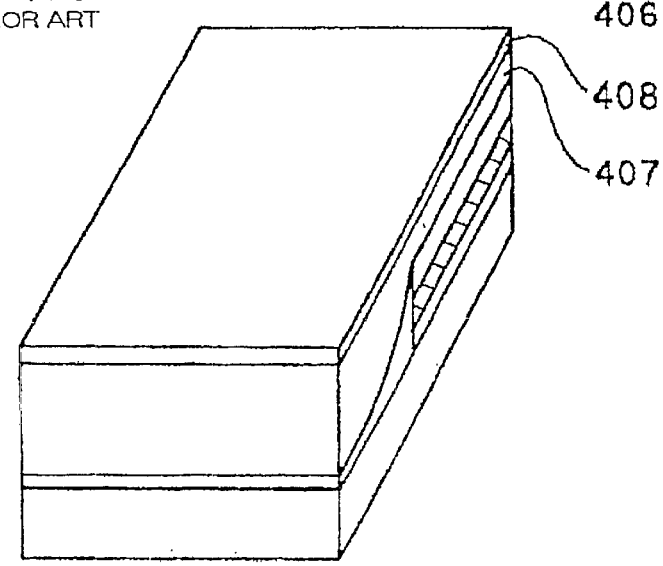
Figure 1D:
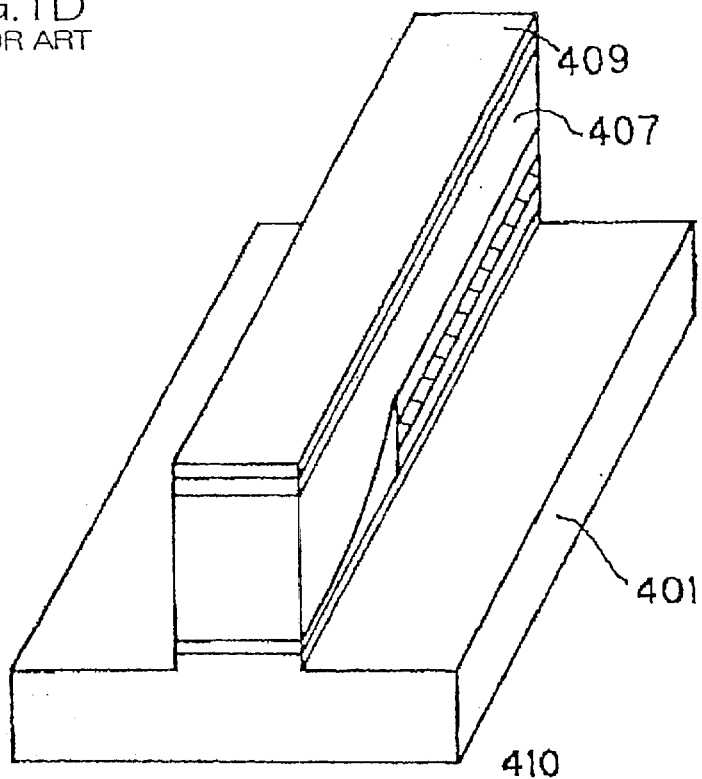
Figure 1E:
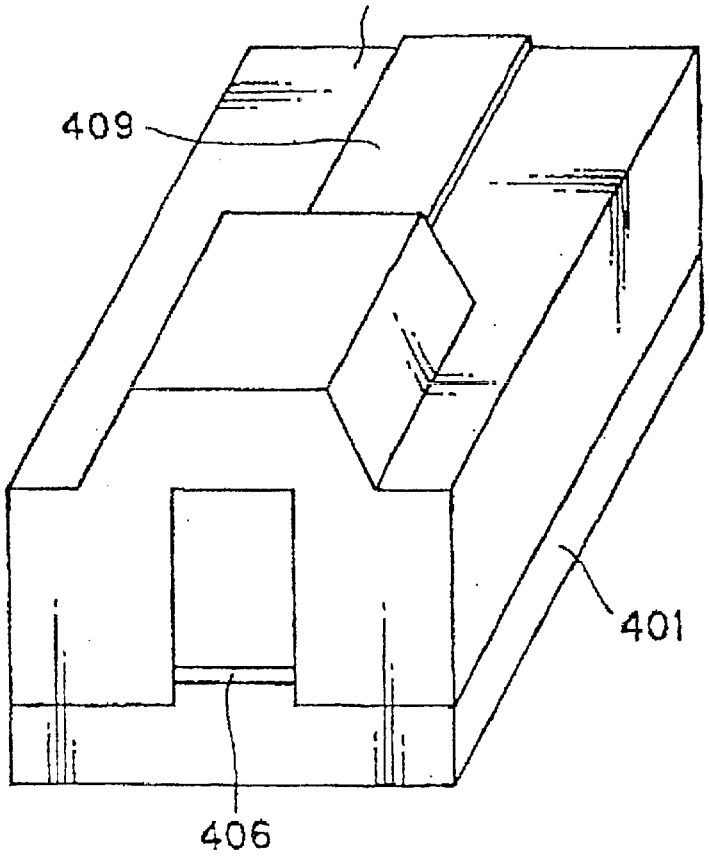
Figure 3:
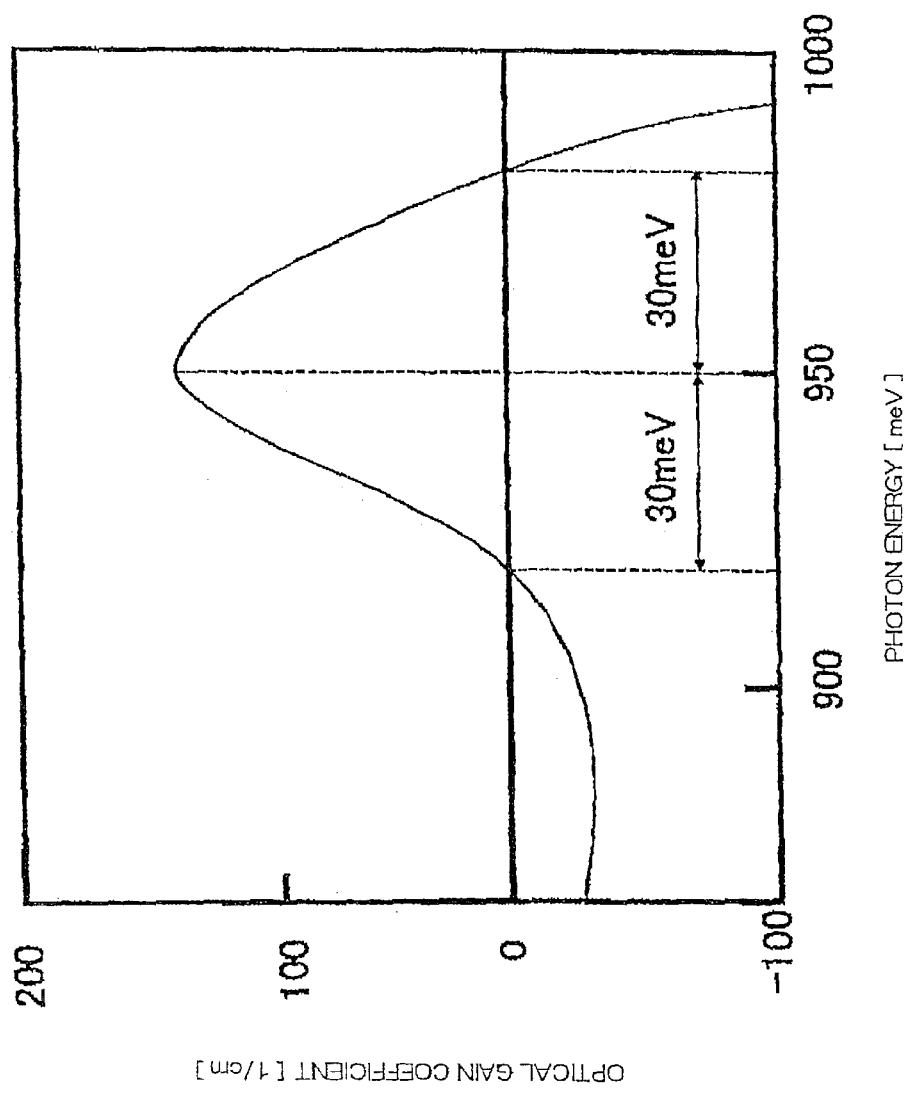
FIG. 3 is a graph showing a relation between an optical gain coefficient and photon energy.
Figure 4:
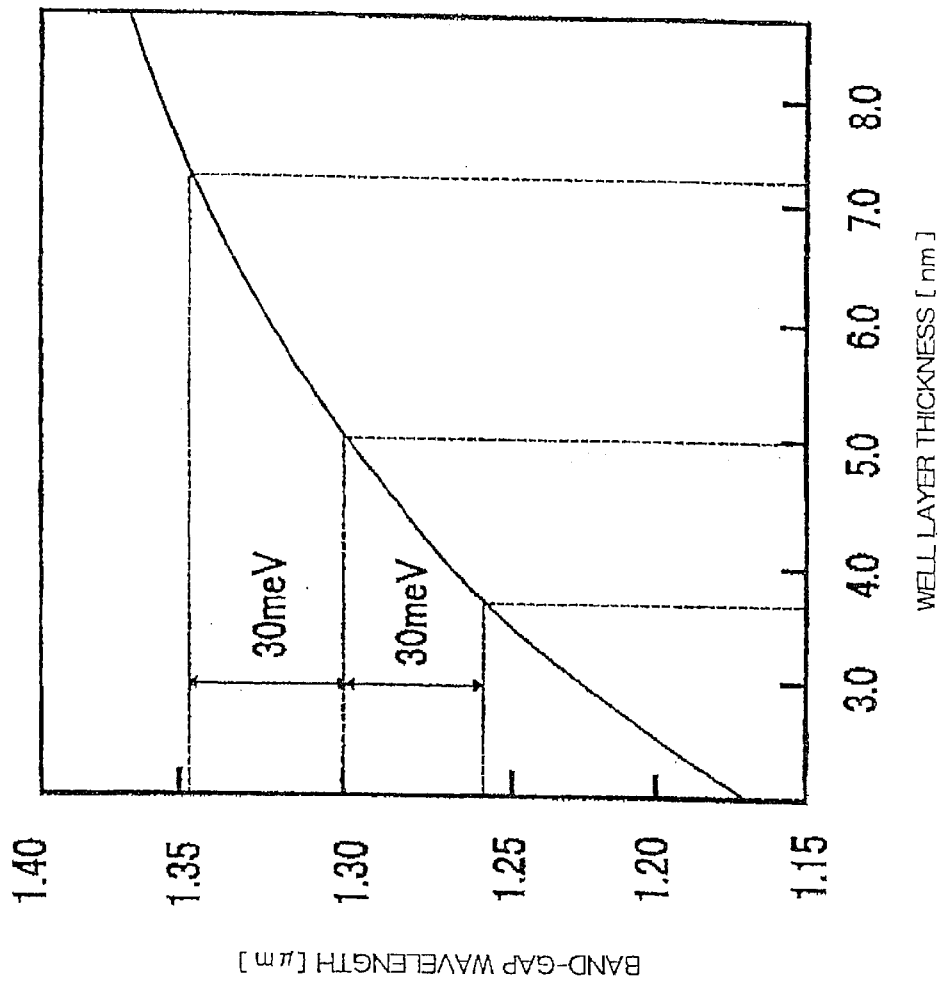
FIG. 4 is a graph showing a relation between a band-gap wavelength and a thickness of a well layer.
Figure 5:
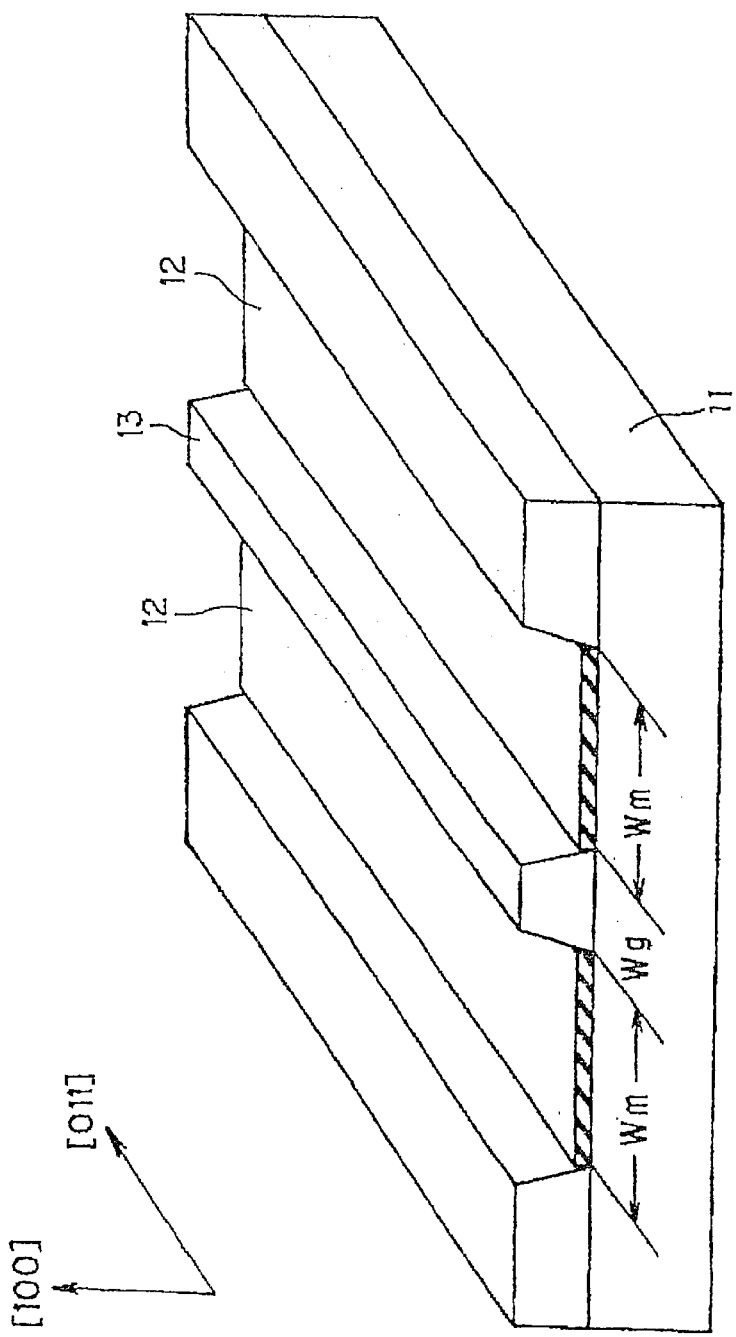
FIG. 5 is a perspective view illustrating MOVPE selective growth for explaining the principle of the invention.
Figure 6:
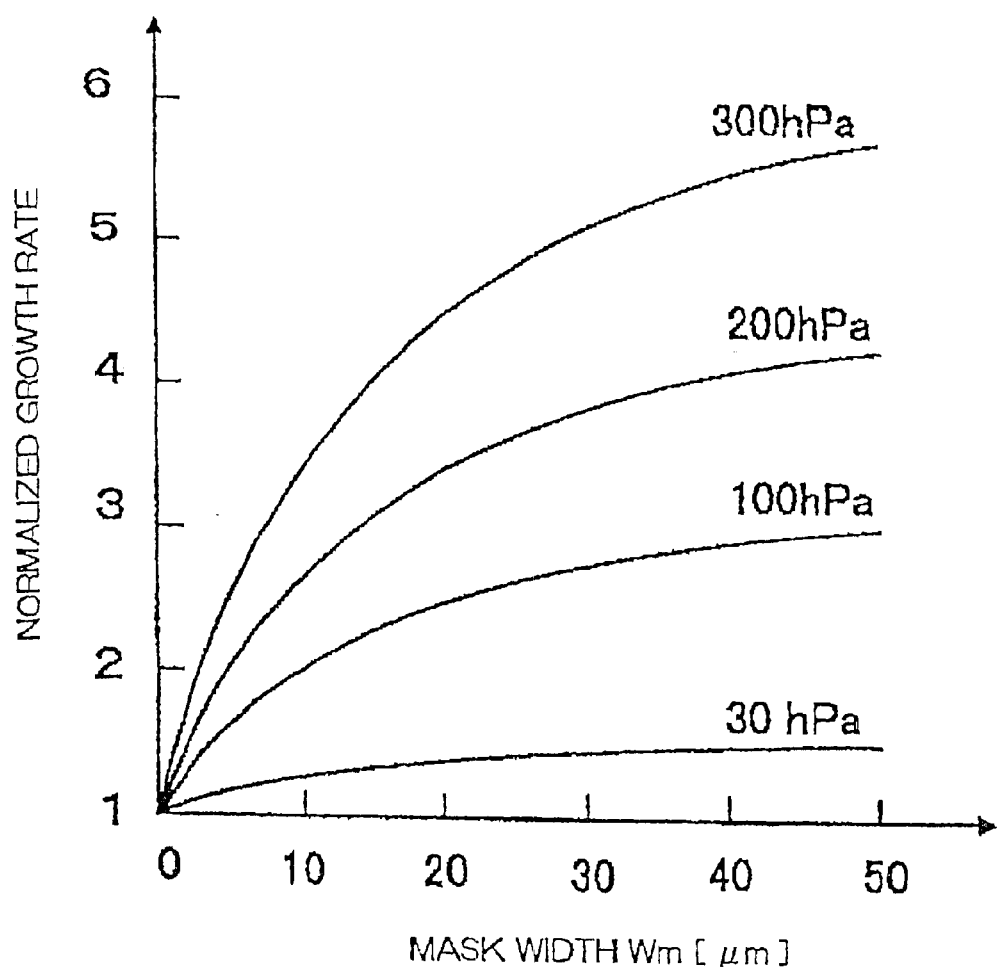
FIG. 6 is a graph showing a relation between a normalized growth rate and a mask width.
Figure 7:
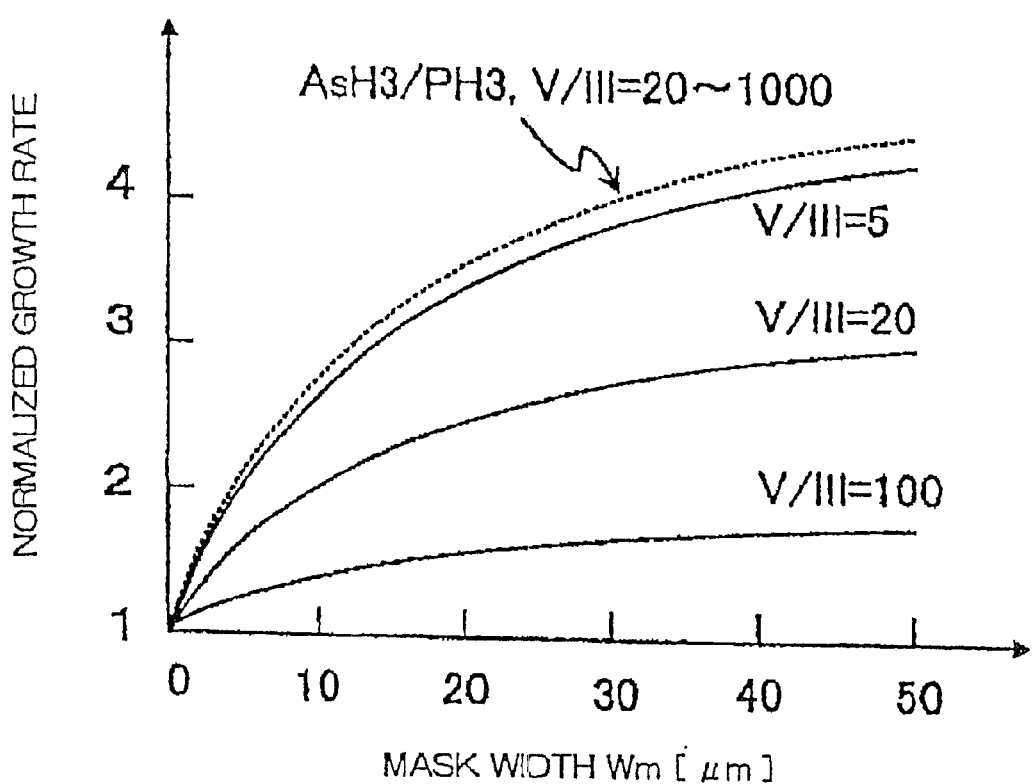
FIG. 7 is a graph showing a relation between a normalized growth rate and a mask width.
Figure 8A:
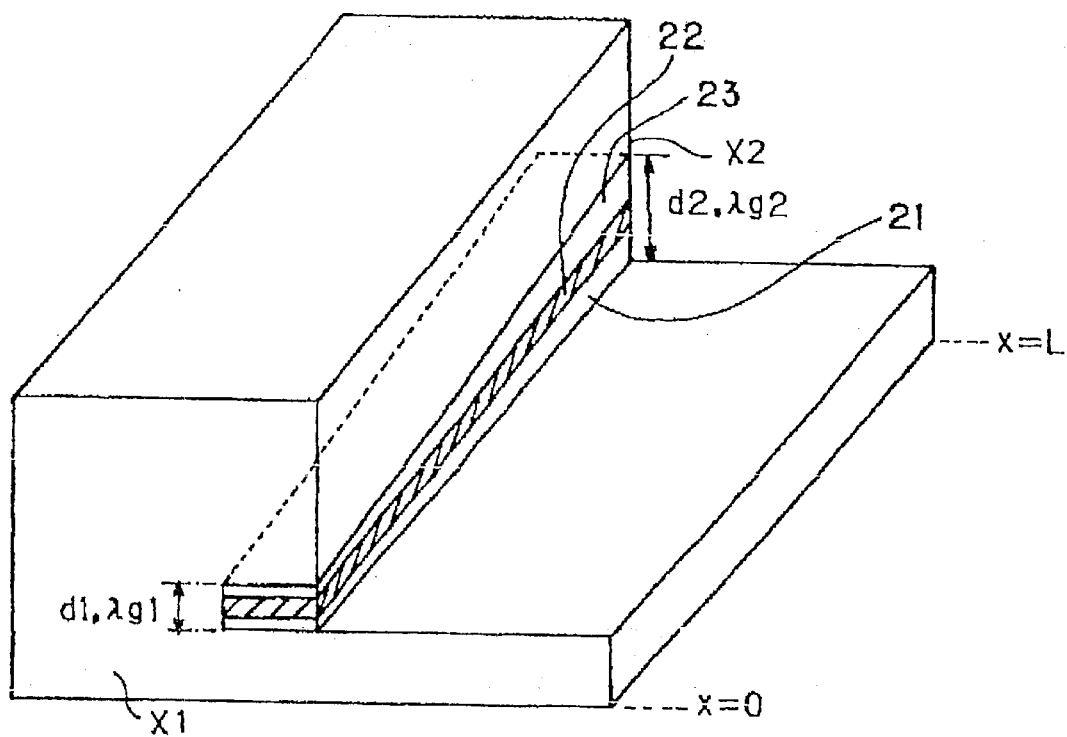
FIG. 8A is a perspective view illustrating a semiconductor laser diode in accordance with the first embodiment of the present invention.
Figure 8B:
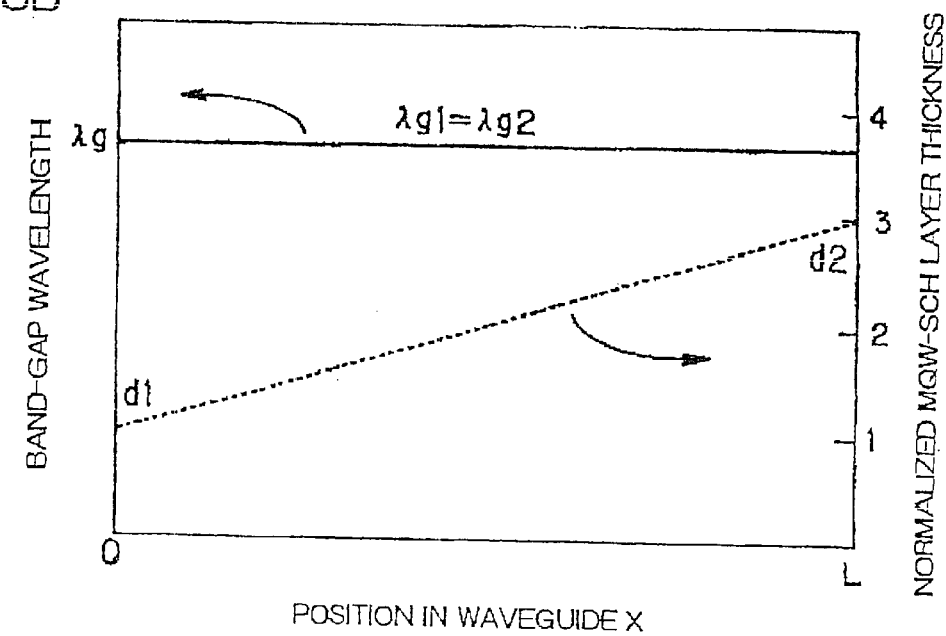
FIG. 8B is a graph showing a relation (a) a band-gap wavelength, a thickness of a MQW-SCH layer and (b) a waveguide position in the first embodiment.

FIG. 8A illustrates an optical semiconductor device in accordance with the first embodiment. The illustrated SSC-LD includes an optical waveguide comprising a first separate confinement hetero-structure (SCH) layer 21, a multi-quantum well (MQW) layer 22, and a second SCH layer 23. The MQW layer 22 is designed to have a constant thickness in its entire length, whereas the first and second SCH layers 21 and 23 are designed to have a thickness gradually decreasing from a first end plane X2 to a second end plane X1 at which lights leave the SSC-LD. Hence, the optical waveguide becomes thinner toward the second end plane X1. The SCH layers 21 and 23 are designed to be thicker than the MQW layer 22 at the first end plane X2, but thinner than the MQW layer 22 at the second end plane X1.

A band-gap wavelength is almost constant in an entire length of the waveguide in the illustrated SSC-LD having the above-mentioned structure, ensuring an optical gain in the entire length of the waveguide. In addition, a function of spot-size conversion (SSC) can be obtained in the entire length of the waveguide, and beams having a narrower divergence angle are emitted through the light-emitting end plane X1.

Suppose that a total thickness of the first and second SCH layers 21, 23 and the MQW layer 22 is represented with d1 and a band-gap wavelength is represented with $\lambda g1$ at the light-emitting end plane X1, and that a total thickness of the layers 21, 22 and 23 is represented with d2 and a band-gap wavelength is represented with $\lambda g2$ at the first end plane X2, the band-gap wavelength is almost constant in the entire length of the waveguide, namely $\lambda g1 \approx \lambda g2$. In contrast, the total thickness of the layers 21, 22 and 23 becomes smaller from d1 to d2 towards the light-emitting end plane X1. Herein, a thickness ratio of d1 to d2 is preferably equal to or greater than 2. The above-mentioned band-gap wavelength profile and thickness profile is applicable to SSC-pin-PD.

[Second Embodiment]

Figure 9A:
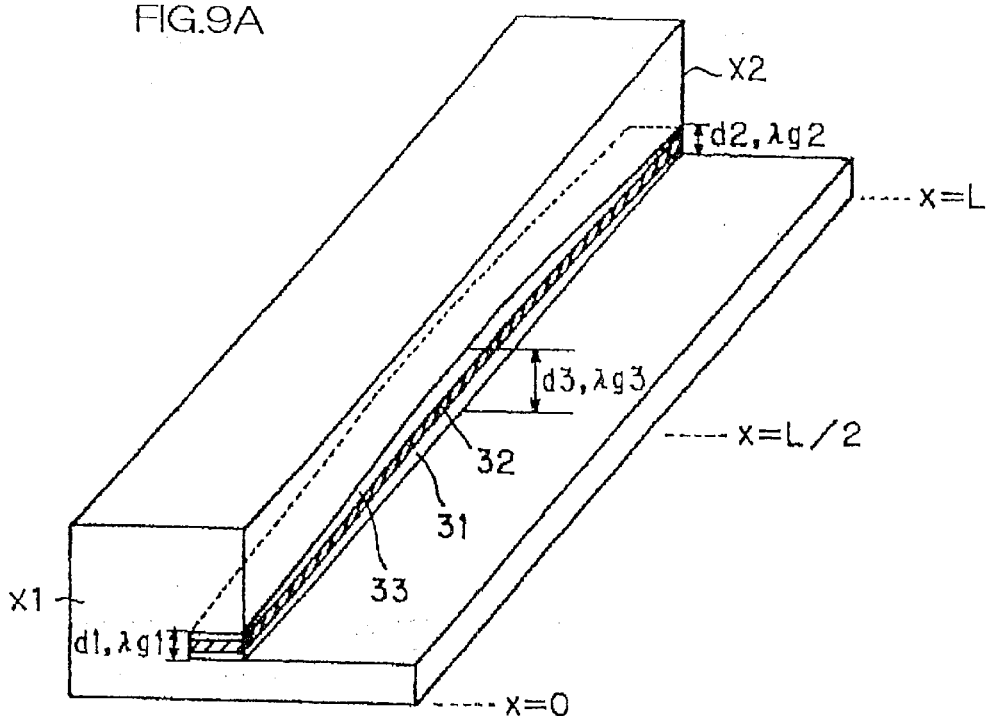
FIG. 9A is a perspective view illustrating a semiconductor laser diode in accordance with the second embodiment of the present invention.

FIG. 9A illustrates an optical semiconductor device in accordance with the second embodiment. In the instant embodiment, an optical semiconductor device is embodied as an SSC-modulator or an SSC-amplifier.

In an optical modulator and an optical amplifier, opposite end planes X2 and X1 serve as an optical path through which lights are introduced thereinto and leave a device. Accordingly, it is necessary to form SSC structures at opposite end planes X2 and X1 in an optical modulator and an optical amplifier. An optical waveguide in the instant embodiment comprises a first SCH layer 31, an MQW layer 32, and a second SCH layer 33. The MQW layer is designed to have an almost constant thickness in an entire length of the waveguide. In contrast, the first and second SCH layers 31 and 33 are designed to have a thickness which is maximum at the center of the entire length of the waveguide, and is gradually decreasing towards the end planes X2 and X1. The waveguide has a thickness which is constant in a central portion (see FIG. 9B) in the length thereof, and is gradually decreasing towards the end planes X2 and X1. Specifically, the thickness of the waveguide is d3 in the central portion, and is d1 and d2 at the end planes X1 and X2, where d1 and d2 are smaller than d3. In the illustrated waveguide, the SSC function can be obtained in regions where the thickness varies from d3 to d1 or d2.

Figure 9B:
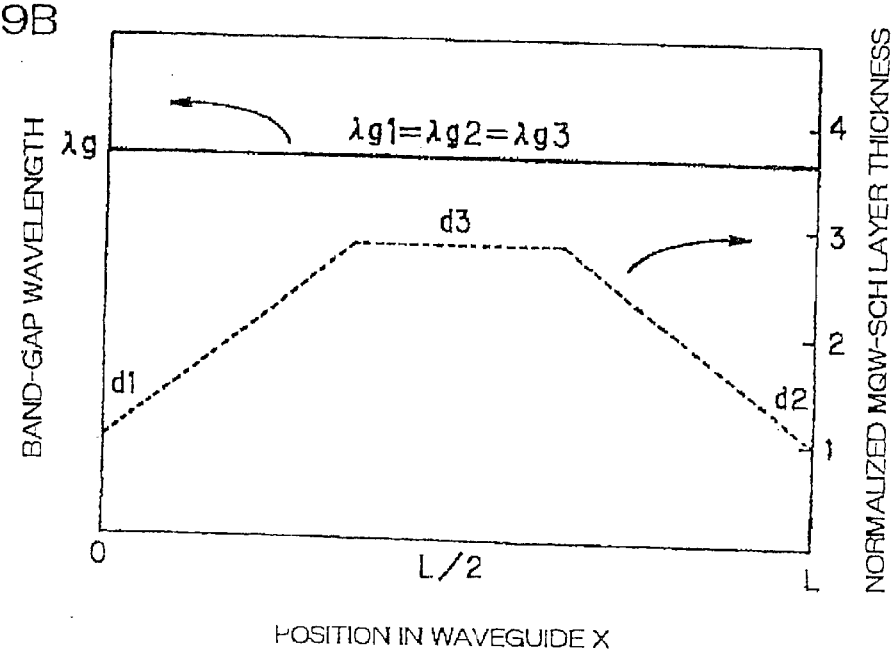
FIG. 9B is a graph showing a relation (a) a band-gap wavelength, a thickness of a MQW-SCH layer and (b) a waveguide position in the second embodiment.

As illustrated in FIG. 9B, a band-gap wavelength $\lambda g3$ in the central portion is almost equal to band-gap wavelengths $\lambda g1$ and $\lambda g2$ at the light-introducing and light-emitting end planes X1 and X2. Hence, an optical gain can be obtained in the entire length of the waveguide, and accordingly a great gain is obtained without making a device longer when a device is embodied as an SSC-amplifier. As an alternative, when a device is embodied as an electro-absorption type modulator, it is possible to carry out modulation in an entire length thereof, ensuring a great extinction ratio without making a device longer.

[Third Embodiment]

Figure 10:
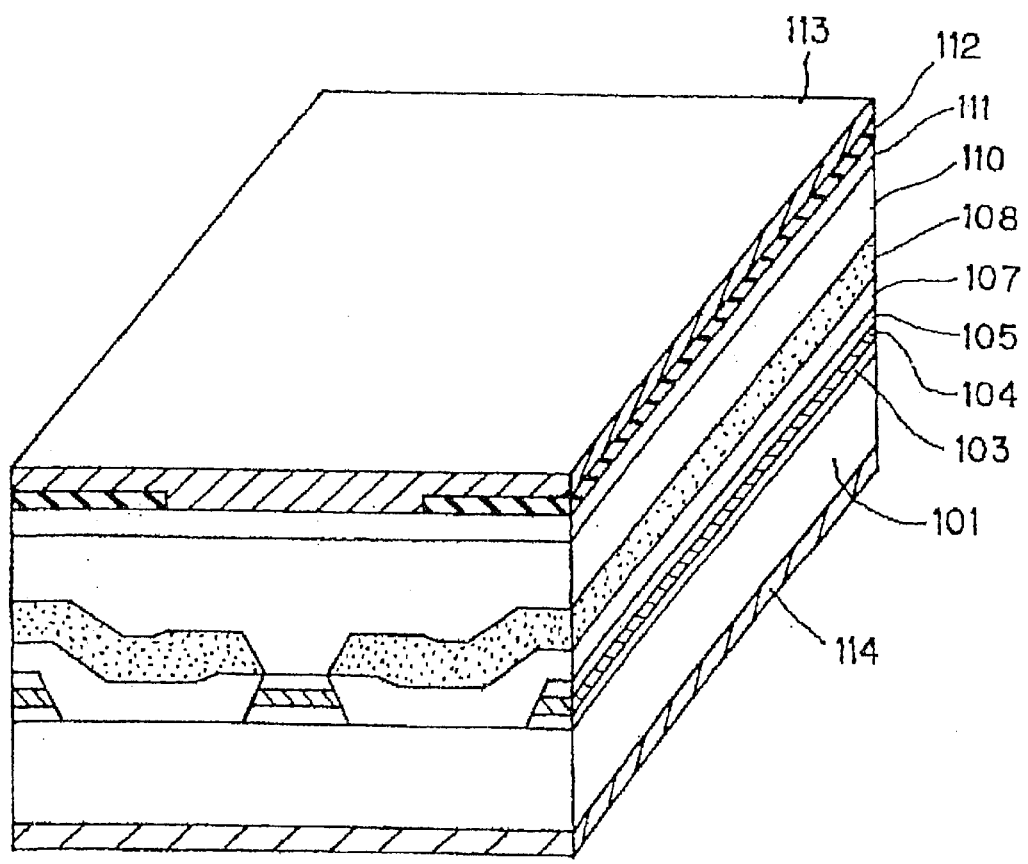
FIG. 10 is a perspective view illustrating an optical semiconductor device in accordance with the third to eighth embodiments of the invention.

FIGS. 10 and 11A to 11E illustrate an SSC-LD in accordance with the third embodiment. FIGS. 11A to 11E are cross-sectional views of the SSC-LD, illustrating respective step of a method of fabricating the same. FIG. 10 is a perspective view of the SSC-LD in accordance with the third embodiment.

Figure 11A:
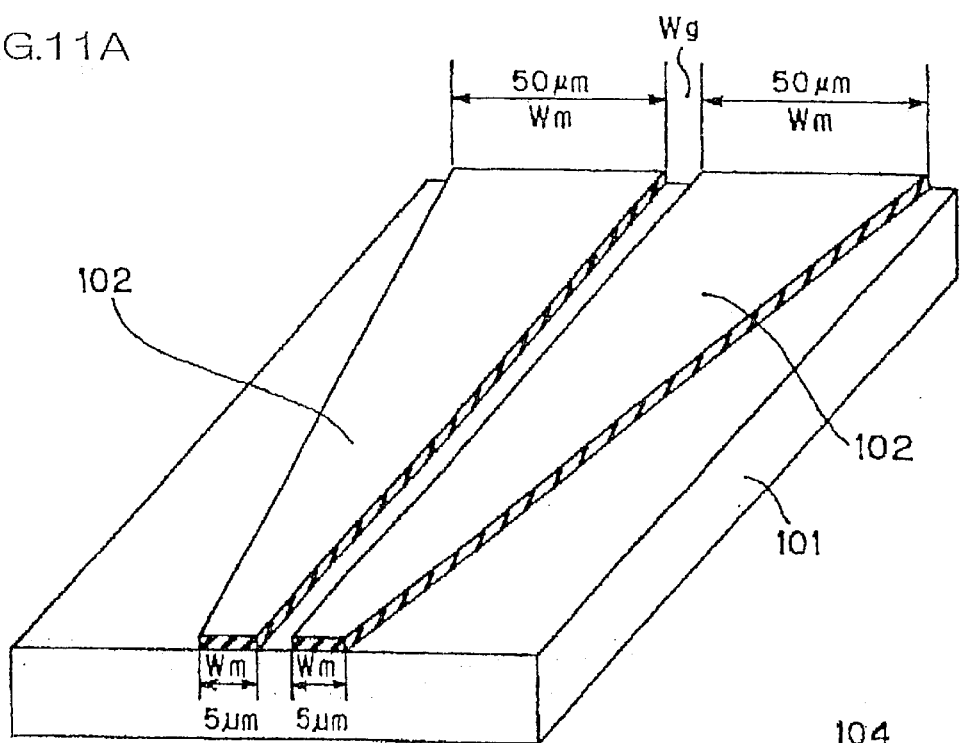
FIGS. 11A and 11B are perspective views of an optical semiconductor device in accordance with the third and fifth to ninth embodiments of the invention, illustrating respective steps of a method of fabricating the same.

A silicon dioxide ($SiO_2$) layer is formed on an n-InP substrate 101 having a (100) plane as a principal plane. The silicon dioxide layer is deposited by atmospheric chemical vapor deposition (CVD) by a thickness of 100 nm. Then, the silicon dioxide layer is patterned to thereby form a pair of masks 102 in such a manner that a gap to be formed between the masks 102 is oriented in [011] direction, as illustrated in FIG. 11A.

Figure 11B:
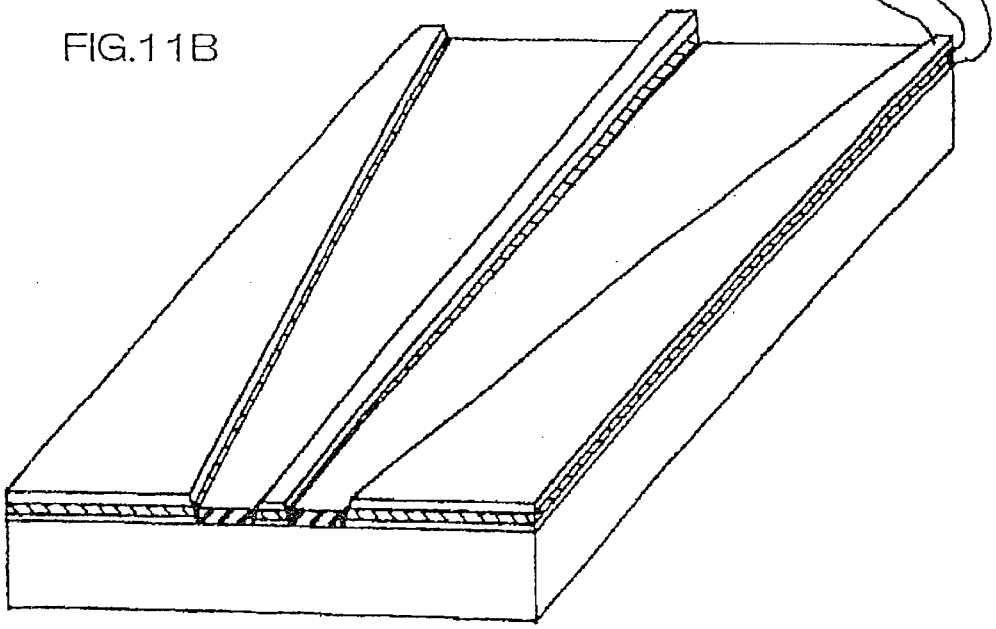

The gap formed between the masks 102 has a width Wg of 1.5 $\mu$m, and each of the masks 102 has a width Wm successively varying from 50 $\mu$m to 5 $\mu$m. The illustrated SSC-LD is 300 $\mu$m long. A MQW-SCH optical waveguide comprising a first SCH layer 103, an MQW layer 104, and a second SCH layer 105 is formed by MOVPE selective growth onto the 1.5 $\mu$m-gap, as illustrated in FIG. 11B. A growth temperature is 625° C. Source materials used are trimethylindium [$In(CH_3)_3$] (TMI), triethylgallium [$Ga(C_2H_5)_3$] (TEG), diethylzinc [$Zn(C_2H_5)_2$] (DEZ), arsine ($AsH_3$), phosphine ($PH_3$), and disilane ($Si_2H_6$).

The optical waveguide is constituted of the following layers:

(a) n-$In_{0.810}Ga_{0.190}As_{0.405}P_{0.695}$ SCH layer having a carrier concentration of $1 \times 10^{18}$ cm$^{-3}$ and a thickness of 70 nm;

(b) an undoped $In_{0.810}Ga_{0.190}GA_{0.405}P_{0.595}$ SCH layer having a thickness of 30 nm;

(c) a multi-quantum well active layer consisting of five cycles of an undoped $In_{0.806}Ga_{0.194}As_{0.632}P_{0.368}$ well layer having a thickness of 5 nm and an $In_{810}Ga_{0.190}As_{0.405}P_{0.595}$ barrier layer having a thickness of 8 nm; and (d) an undoped $In_{0.810}Ga_{0.90}As_{0.405}P_{0.595}$ SCH layer having a thickness of 100 nm.

The thickness of the above-mentioned layers is a thickness measured at the mask width Wm being 50 $\mu$m.

In the selective growth of the above-mentioned MQW-SCH structure, the $In_{0.806}Ga_{0.194}As_{0.632}P_{0.368}$ well layer and the $In_{0.810}Ga_{0.190}As_{0.405}P_{0.595}$ barrier layer were grown under a growth pressure of 30 hPa, and the $In_{0.810}Ga_{0.190}As_{0.405}P_{0.595}$ SCH layer was grown under a growth pressure of 250 hPa.

Figure 12:
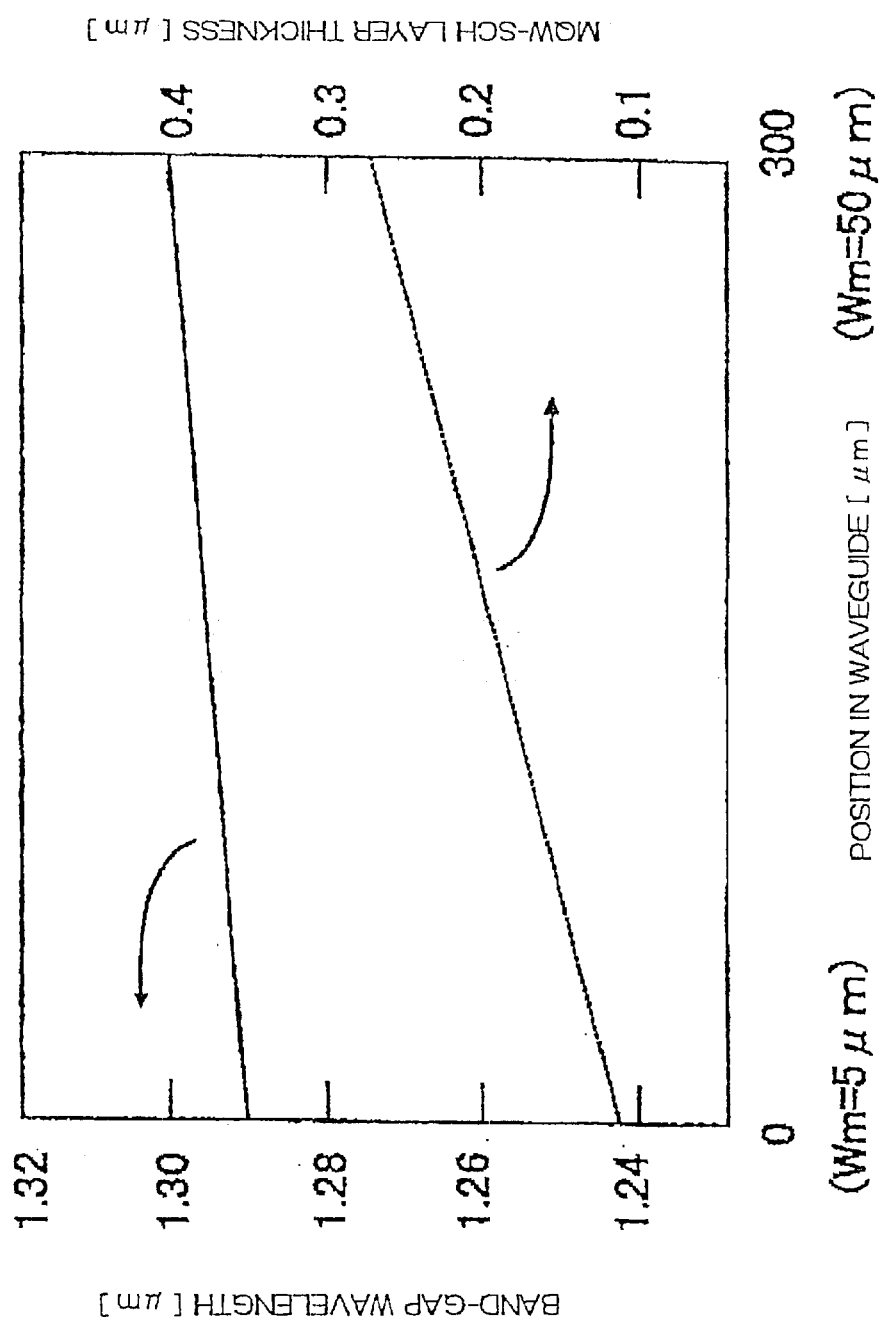
FIG. 12 is a graph showing a relation (a) a band-gap wavelength, a thickness of a MQW-SCH layer and (b) a waveguide position in the third and ninth embodiments.

FIG. 12 is a graph showing photoluminescence (PL) peak wavelength measured in the lengthwise direction of the 300 $\mu$m-long SSC-LD illustrated in FIG. 10, and a thickness of the MQW-SCH layer measured by means of a scanning electron microscope (SEM). The PL peak wavelength and the thickness at the mask width Wm being 50 $\mu$m are 1.3 $\mu$m and 0.27 $\mu$m, respectively, whereas the PL peak wavelength and the thickness at the mask width Wm being 5 $\mu$m are 1.29 $\mu$m and 0.11 $\mu$m, respectively.

Figure 11C:
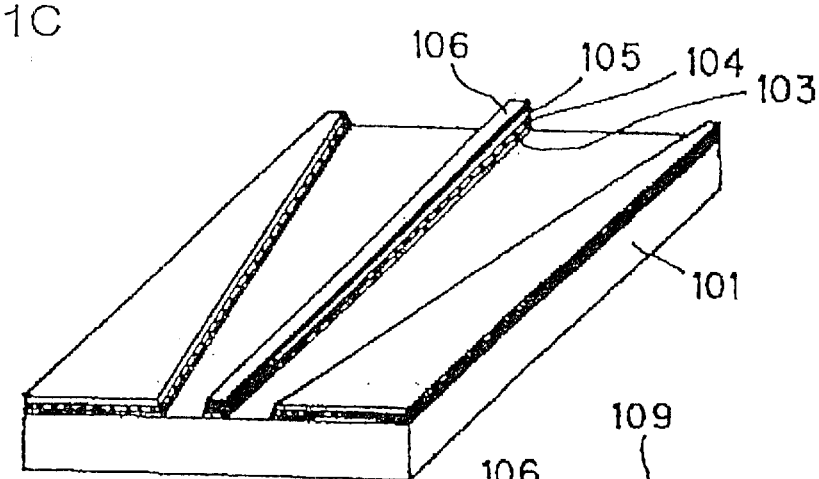
FIGS. 11C to 11E are perspective views of an optical semiconductor device in accordance with the third to seventh and eleventh embodiments of the invention, illustrating respective steps of a method of fabricating the same.

Then, the $SiO_2$ masks 102 are removed, followed by formation of a mask 106 onto the stripe-shaped MQW-SCH structure comprising the first SCH layer 103, the MQW layer 104, and the second SCH layer 105, as illustrated in FIG. 11C. The mask 106 is made of silicon dioxide ($SiO_2$).

Figure 11D:
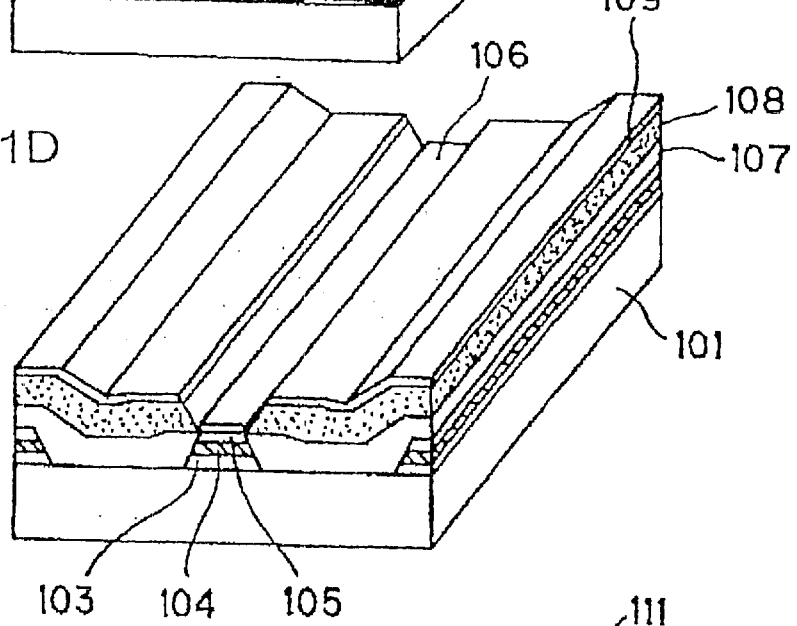

Then, as illustrated in FIG. 11D, the MQW-SCH structure is buried at opposite sides thereof with the following layers by MOVPE selective growth:

(a) p-InP layer 107 having a carrier concentration of $5 \times 10^{17}$ $cm^{-3}$ and a thickness of 0.5 $\mu$m;

(b) n-InP layer 108 having a carrier concentration of $7 \times 10^{17}$ $cm^{-3}$ and a thickness of 0.75 $\mu$m; and (c) p-InP layer 109 having a carrier concentration of $1 \times 10^{18}$ $cm^{-3}$ and a thickness of 0.1 $\mu$m.

The p-InP layer 109 is formed in order to prevent formation of pn-junction at a re-growth interface, and is not indispensable for the present invention.

Figure 11E:
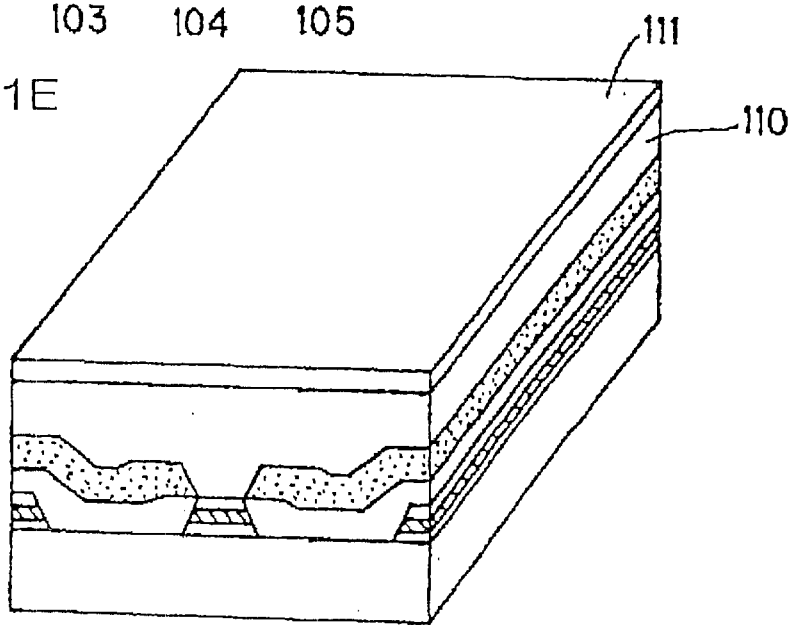

Then, the $SiO_2$ mask 106 formed onto the MQW-SCH structure is removed, and thereafter, there are formed p-InP clad layer 110 having a carrier concentration of $1 \times 10^{18}$ $cm^{-3}$ and a thickness of 3.0 $\mu$m and $p^+$-$In_{0.53}Ga_{0.47}As$ cap layer 111 having a carrier concentration of $6 \times 10^{18}$ $cm^{-3}$ and a thickness of 0.3 $\mu$m over the product, as illustrated in FIG. 11E.

Flow rates of source gases employed for MOVPE selective growth of InP, InGaAsP and InGaAs are as follows.

(a) p-InP: TMI=375 cc/min, $PH_3$=125 cc/min, DEZ=6.00 cc/min.

(b) n-$In_{0.810}Ga_{0.190}As_{0.405}P_{0.595}$: TMI=142 cc/min, TEG=22.7 cc/min, $AsH_3$=7.20 cc/min, $PH_3$=125 cc/min, $Si_2H_6$=7.50 cc/min.

(c) $In_{0.810}Ga_{0.190}As_{0.405}P_{0.595}$: TMI=142 cc/min, TEG=22.7 cc/min, $AsH_3$=7.20 cc/min, $PH_3$=125 cc/min.

(d) $In_{0.806}Ga_{0.194}As_{0.632}P_{0.368}$: TMI=142 cc/min, TEG=23.2 cc/min, $AsH_3$=26.8 cc/min, $PH_3$=83.8 cc/min.

(e) $In_{0.53}Ga_{0.47}As$: TMI=65 cc/min, TEG=54 cc/min, $AsH_3$=112.0 cc/min,

After MOVPE growth has been completed, there is formed a silicon dioxide film 112 over the $p^+$-$In_{0.53}Ga_{0.47}As$ cap layer 111 in such a manner that the silicon dioxide film 112 has an opening above the active layer. Then, a p-side electrode 113 is formed over the silicon dioxide film 112, and an n-side electrode 114 is formed onto a lower surface of the n-InP substrate 101. Then, the product is cut out into a piece having a device length of 300 $\mu$m. The thus formed semiconductor laser diode in accordance with the instant embodiment is illustrated in FIG. 10.

A 30%-reflective coating and a 90%-reflective coating were applied to the front and rear end planes of the thus formed semiconductor laser diode, respectively, and then measurement was conducted. Herein, the front end plane is the end plane at the mask width Wm being 5 $\mu$m at selective growth, and the rear end plane is the end plane at the mask width Wm being 50 $\mu$m at selective growth. The results were as follows.

|  | 25° C. | 90° C. |
| --- | --- | --- |
| Laser oscillation wavelength | 1.31 $\mu$m | 1.33 $\mu$m |
| Threshold current | 6.0 mA | 14.5 mA |
| Slope efficiency | 0.55 W/A | 0.45 W/A |

Far field pattern (FFP) was also measured. A divergence angle at the rear end plane was 27°×30°, whereas a divergence angle at the front end plane was 11°×12°. Subsequently, a coupling characteristic with a flat ended single-mode fiber (1.3 $\mu$m zero dispersion), anti-reflective coating was applied to an end plane of which, was evaluated. When the semiconductor laser diode was got close to the fiber by a spacing of 10 $\mu$m, there was obtained the maximum coupling efficiency of −2.2 dB.

A theoretical yield in the number of devices to be obtained from a 2-inch wafer having gone through wafer process is 32,724, in which case it is supposed that a chip is 300 $\mu$m×200 $\mu$m in size. In the experiment, 27,815 devices exhibited at 25° C. that a threshold current was equal to or smaller than 8 mA, a slope efficiency was equal to or greater than 0.50 W/A, and a divergence angle is equal to or smaller than 13°×14°. Average values (±standard deviation) among the 27,815 devices exhibit extremely high uniformity as follows.

A threshold current: 6.45 mA±0.22 mA

A slope efficiency: 0.535 W/A±0.002 W/A

A divergence angle at the front end plane: (11.4°±0.86°)× (12.6°±0.92°)

[Fourth Embodiment]

FIGS. 10, 11C to 11E, 13A, 13B and 14 illustrate an SSC-LD in accordance with the fourth embodiment. FIGS. 13A, 13B and 11C to 11E are cross-sectional views of the SSC-LD, illustrating respective step of a method of fabricating the same. FIG. 10 is a perspective view of the SSC-LD in accordance with the fourth embodiment.

Figure 13A:
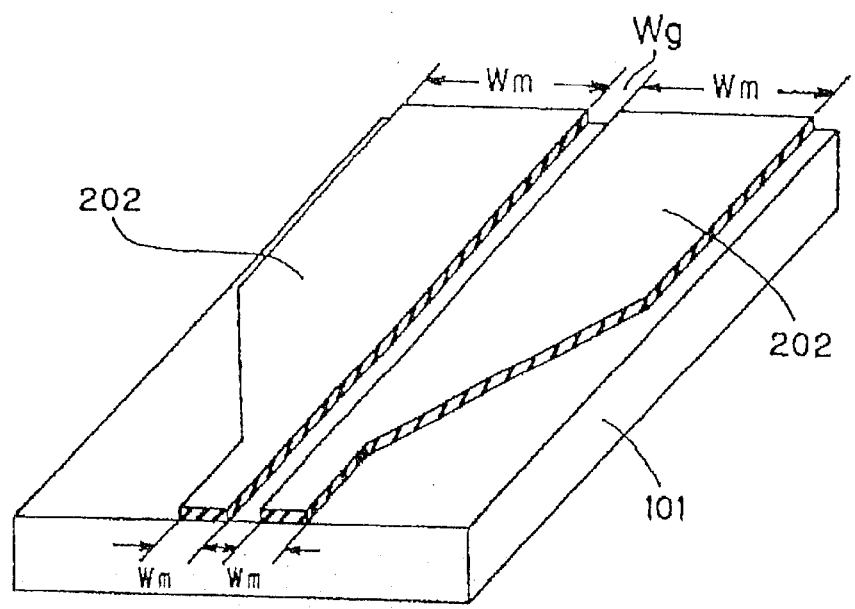
FIGS. 13A and 13B are perspective views of an optical semiconductor device in accordance with the fourth embodiment of the invention, illustrating respective steps of a method of fabricating the same.

A silicon dioxide ($SiO_2$) layer is formed on an n-InP substrate 101 having a (100) plane as a principal plane. The silicon dioxide layer is deposited by atmospheric chemical vapor deposition (CVD) by a thickness of 100 nm. Then, the silicon dioxide layer is patterned to thereby form a pair of masks 202 in such a manner that a gap to be formed between the masks 202 is oriented in [011] direction, as illustrated in FIG. 13A.

Figure 13B:
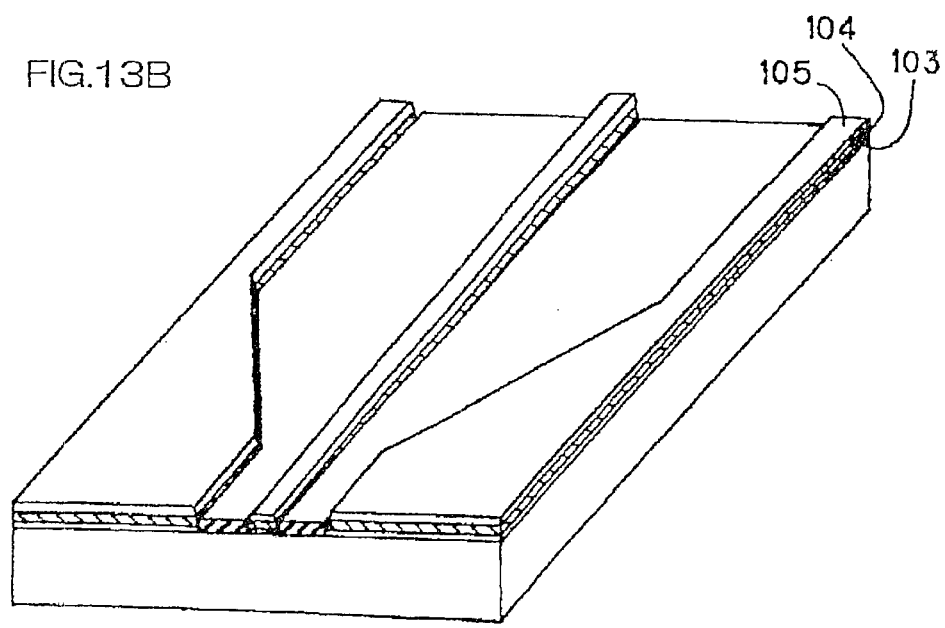

The gap formed between the masks 202 has a width Wg of 1.5 $\mu$m. Each of the masks 202 consists of a first end region having a width Wm of 50 $\mu$m and a length of 150 $\mu$m, a second end region having a width Wm of 5 $\mu$m and a length of 50 $\mu$m, and a tapered region connecting the first and second end regions with each other, having a width varying from 50 $\mu$m to 5 $\mu$m and a length of 100 $\mu$m. The illustrated SSC-LD is 300 $\mu$m long. A MQW-SCH optical waveguide comprising a first SCH layer 103, an MQW layer 104, and a second SCH layer 105 is formed by MOVPE selective growth onto the 1.5 $\mu$m-gap, as illustrated in FIG. 13B. The growth conditions and the structure of MQW-SCH waveguide are the same as those of the third embodiment.

Figure 14:
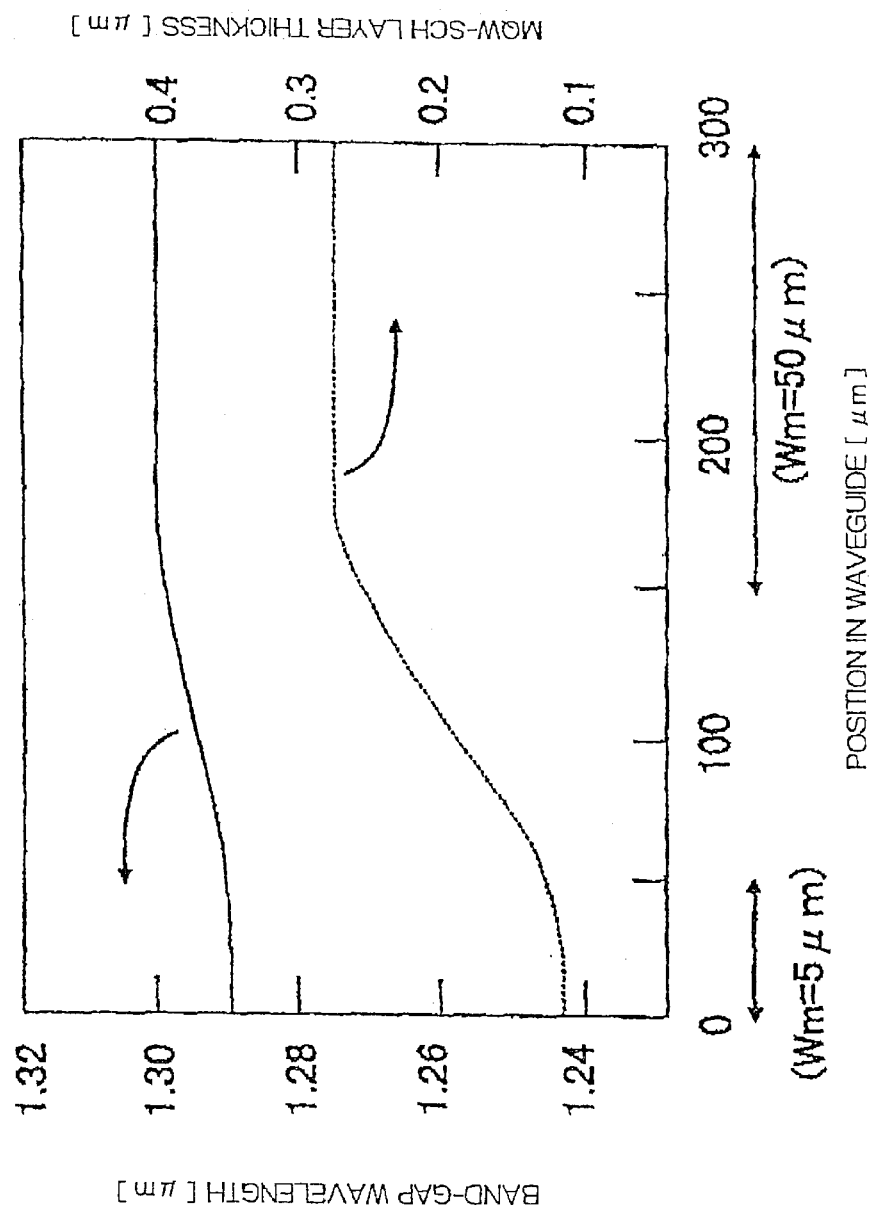
FIG. 14 is a graph showing a relation (a) a band-gap wavelength, a thickness of a MQW-SCH layer and (b) a waveguide position in the fourth embodiment.

FIG. 14 is a graph showing photoluminescence (PL) peak wavelength measured in the lengthwise direction of the 300 $\mu$m-long SSC-LD illustrated in FIG. 10, and a thickness of the MQW-SCH layer measured by means of a scanning electron microscope (SEM). The PL peak wavelength and the thickness at the mask width Wm being 50 $\mu$m are 1.30

μm and 0.27 μm, respectively, whereas the PL peak wavelength and the thickness at the mask width Wm being 5 μm are 1.29 μm and 0.11 μm, respectively.

Thereafter, as illustrated in FIGS. 11C to 11E, a current blocking structure, a clad layer, and a cap layer are formed by MOVPE selective growth, followed by the formation of electrodes, in the similar way as the third embodiment. Thus, there is obtained the semiconductor laser diode as illustrated in FIG. 10.

Then, the product was cut out into a piece having a device length of 300 μm. A 30%-reflective coating and a 90%-reflective coating were applied to the front and rear end planes of the thus formed semiconductor laser diode, respectively, and then measurement was conducted. Herein, the front end plane is the end plane at the mask width Wm being 5 μm at selective growth, and the rear end plane is the end plane at the mask width Wm being 50 μm at selective growth. The results were as follows.

|  | 25° C. | 90° C. |
| --- | --- | --- |
| Laser oscillation wavelength | 1.31 μm | 1.33 μm |
| Threshold current | 5.8 mA | 14.0 mA |
| Slope efficiency | 0.56 W/A | 0.46 W/A |

Far field pattern (FFP) was also measured. A divergence angle at the rear end plane was 27°×30°, whereas a divergence angle at the front end plane was 11°×12°. Subsequently, a coupling characteristic with a flat ended single-mode fiber (1.3 μm zero dispersion), anti-reflective coating was applied to an end plane of which, was evaluated. When the semiconductor laser diode was got close to the fiber by a spacing of 10 μm, there was obtained the maximum coupling efficiency of −2.1 dB.

A theoretical yield in the number of devices to be obtained from a 2-inch wafer having gone through wafer process is 32,724, in which case it is supposed that a chip is 300 μm×200 μm in size. In the experiment, 28,110 devices exhibited at 25° C. that a threshold current was equal to or smaller than 8 mA, a slope efficiency was equal to or greater than 0.50 W/A, and a divergence angle is equal to or smaller than 13°×14°. Average values (±standard deviation) among the 28,110 devices exhibit extremely high uniformity as follows.

A threshold current: 6.21 mA±0.21 mA

A slope efficiency: 0.540 W/A±0.002 W/A

A divergence angle at the front end plane: (11.1°±0.84°)× (12.1°±0.88°)

[Fifth Embodiment]

FIGS. 10, 11A to 11E and 15 illustrate an SSC-LD in accordance with the fifth embodiment. FIGS. 11A to 11E are cross-sectional views of the SSC-LD, illustrating respective step of a method of fabricating the same. FIG. 10 is a perspective view of the SSC-LD in accordance with the fifth embodiment.

A silicon dioxide ($SiO_2$) layer is formed on an n-InP substrate 101 having a (100) plane as a principal plane. The silicon dioxide layer is deposited by atmospheric CVD by a thickness of 100 nm. Then, the silicon dioxide layer is patterned to thereby form a pair of masks 102 in such a manner that a gap to be formed between the masks 102 is oriented in [011] direction, as illustrated in FIG. 11A.

The gap formed between the masks 102 has a width Wg of 1.5 μm, and each of the masks 102 has a width Wm successively varying from 50 μm to 5 μm. The illustrated SSC-LD is 300 μm long. A MQW-SCH optical waveguide comprising a first SCH layer 103, an MQW layer 104, and a second SCH layer 105 is formed by MOVPE selective growth onto the 1.5 μm-gap, as illustrated in FIG. 11B. A growth temperature is 625 ° C. Source materials used are trimethylindium [$In(CH_3)_3$], triethylgallium [$Ga(C_2H_5)_3$], diethylzinc [$Zn(C_2H_5)_2$], tertiarybutylarsine [$(CH_3)_3CAsH_2$] (TBA), tertiarybutylphosphine [$(CH_3)_3CPH_2$] (TBP), and disilane ($Si_2H_6$).

The optical waveguide is constituted of the following layers:

(a) n-$In_{0.810}Ga_{0.190}As_{0.405}P_{0.595}$ SCH layer having a carrier concentration of $1\times10^{18}$ cm$^{-3}$ and a thickness of 70 nm;

(b) an undoped $In_{0.810}Ga_{0.190}As_{0.405}P_{0.595}$ SCH layer having a thickness of 30 nm;

(c) a multi-quantum well active layer consisting of five cycles of an undoped $In_{0.806}Ga_{0.194}As_{0.632}P_{0.368}$ well layer having a thickness of 5 nm and an $In_{0.810}Ga_{0.190}As_{0.405}P_{0.595}$ barrier layer having a thickness of 8 nm; and (d) an undoped $In_{0.810}Ga_{0.190}As_{0.405}P_{0.595}$ SCH layer having a thickness of 100 nm.

The thickness of the above-mentioned layers is a thickness measured at the mask width Wm being 50 μm.

In the selective growth of the above-mentioned MQW-SCH structure, the $In_{0.806}Ga_{0.194}As_{0.632}P_{0.368}$ well layer and the $In_{0.810}Ga_{0.190}As_{0.405}P_{0.595}$ barrier layer were grown employing TBA and TBP having a V/III ratio of 90, and the $In_{0.810}Ga_{0.190}As_{0.405}P_{0.595}$ SCH layer was grown employing TBA and TBP having a V/III ratio of 4.

Figure 15:
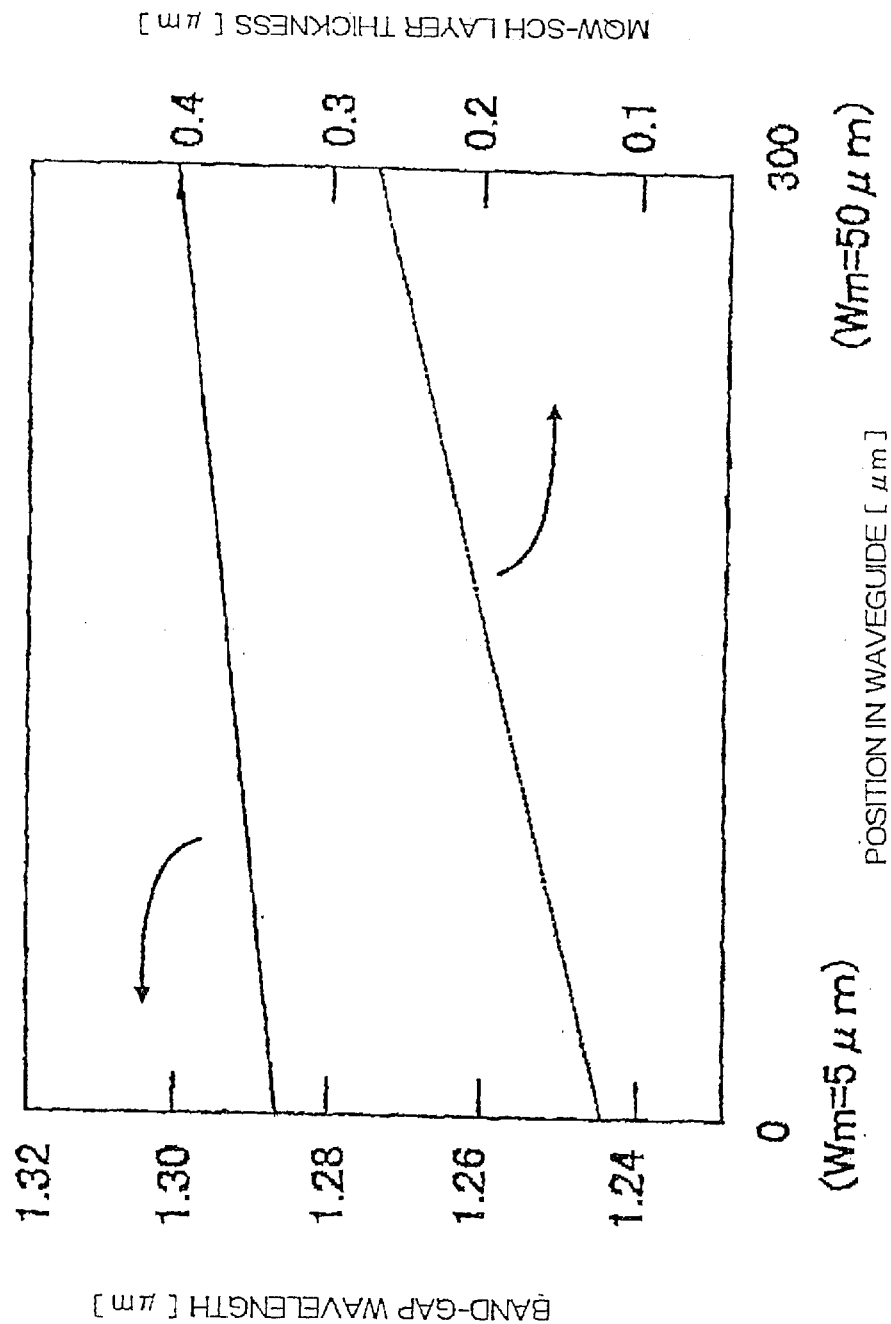
FIG. 15 is a graph showing a relation (a) a band-gap wavelength, a thickness of a MQW-SCH layer and (b) a waveguide position in the fifth embodiment.

FIG. 15 is a graph showing photoluminescence (PL) peak wavelength measured in the lengthwise direction of the 300 μm-long SSC-LD illustrated in FIG. 10, and a thickness of the MQW-SCH layer measured by means of a scanning electron microscope (SEM). The PL peak wavelength and the thickness at the mask width Wm being 50 μm are 1.300 μm and 0.27 μm, respectively, whereas the PL peak wavelength and the thickness at the mask width Wm being 5 μm are 1.285 μm and 0.12 μm, respectively.

Thereafter, as illustrated in FIGS. 11C to 11E, a current blocking structure, a clad layer, and a cap layer are formed by MOVPE selective growth, followed by the formation of electrodes, in the similar way as the third embodiment. Thus, there is obtained the semiconductor laser diode as illustrated in FIG. 10.

Flow rates of source gases employed for MOVPE selective growth of the well layer, barrier layer and SCH layer are as follows.

(a) the $In_{0.806}Ga_{0.194}As_{0.632}P_{0.638}$ well layer: TMI=44 cc/min, TEG=16 cc/min, TBA=26 cc/min, TBP=125 cc/min, V/III=90.

(b) the $In_{0.810}Ga_{0.190}As_{0.405}P_{0.595}$ barrier layer: TMI=142 cc/min, TEG=22.7 cc/min, TBA=17.4 cc/min, TBP= 375 cc/min, V/III=90.

(c) the $In_{0.810}Ga_{0.190}As_{0.405}P_{0.595}$ SCH layer: TMI=284 cc/min, TEG=45.4 cc/min, TBA=1.5 cc/min, TBP= 33.3 cc/min, V/III=4.

The thus formed semiconductor laser diode in accordance with the instant embodiment was cut out into a piece having a device length of 300 μm. A 30%-reflective coating and a 90%-reflective coating were applied to the front and rear end planes of the thus formed semiconductor laser diode, respectively, and then measurement was conducted. The results were as follows.

|                          | 25° C.    | 90° C.    |
|--------------------------|-----------|-----------|
| Laser oscillation wavelength | 1.31 μm | 1.33 μm |
| Threshold current        | 6.0 mA    | 15.5 mA   |
| Slope efficiency         | 0.53 W/A  | 0.43 W/A  |

Far field pattern (FFP) was also measured. A divergence angle at the rear end plane was 27°×30°, whereas a divergence angle at the front end plane was 11.5°×12.5°. Subsequently, a coupling characteristic with a flat ended single-mode fiber (1.3 μm zero dispersion), anti-reflective coating was applied to an end plane of which, was evaluated. When the semiconductor laser diode was got close to the fiber by a spacing of 10 μm, there was obtained the maximum coupling efficiency of −2.4 dB.

A theoretical yield in the number of devices to be obtained from a 2-inch wafer having gone through wafer process is 32,724, in which case it is supposed that a chip is 300 μm×200 μm in size. In the experiment, 27,620 devices exhibited at 25° C. that a threshold current was equal to or smaller than 8 mA, a slope efficiency was equal to or greater than 0.50 W/A, and a divergence angle is equal to or smaller than 13°×14°. Average values (±standard deviation) among the 27,620 devices exhibit extremely high uniformity as follows.

A threshold current: 6.55 mA±0.21 mA
A slope efficiency: 0.530 W/A±0.002 W/A
A divergence angle at the front end plane: (11.9°±0.88°)× (12.9°±0.90°)

[Sixth Embodiment]

FIGS. 10, 11A to 11E and 16 illustrate an SSC-LD in accordance with the sixth embodiment. FIGS. 11A to 11E are cross-sectional views of the SSC-LD, illustrating respective step of a method of fabricating the same. FIG. 10 is a perspective view of the SSC-LD in accordance with the sixth embodiment.

A silicon dioxide ($SiO_2$) layer is formed on an n-InP substrate 101 having a (100) plane as a principal plane. The silicon dioxide layer is deposited by atmospheric CVD by a thickness of 100 nm. Then, the silicon dioxide layer is patterned to thereby form a pair of masks 102 in such a manner that a gap to be formed between the masks 102 is oriented in [011] direction, as illustrated in FIG. 11A.

The gap formed between the masks 102 has a width Wg of 1.5 μm, and each of the masks 102 has a width Wm successively varying from 50 μm to 5 μm. The SSC-LD is 300 μm long. A MQW-SCH optical waveguide comprising a first SCH layer 103, an MQW layer 104, and a second SCH layer 105 is formed by MOVPE selective growth onto the 1.5 μm-gap, as illustrated in FIG. 11B. A growth temperature is 625° C. Source materials used are trimethylindium, triethylgallium, diethylzinc, tertiarybutylarsine, tertiarybutylphosphine, and disilane.

The optical waveguide is constituted of the following layers:

(a) n-$In_{0.810}Ga_{0.190}As_{0.405}P_{0.595}$ layer having a carrier concentration of ×$10^{18}$ cm$^{−3}$ and a thickness of 70 nm;
(b) an undoped $In_{0.810}Ga_{0.190}As_{0.405}P_{0.595}$ layer having a thickness of 30 nm;
(c) a multi-quantum well active layer consisting of five cycles of an undoped $In_{0.806}Ga_{0.194}As_{0.632}P_{0.368}$ well layer having a thickness of 5 nm and an $In_{0.810}Ga_{0.190}As_{0.405}P_{0.595}$ barrier layer having a thickness of 12 nm; and
(d) an undoped $In_{0.810}Ga_{0.190}As_{0.405}P_{0.595}$ layer having a thickness of 100 nm.

The thickness of the above-mentioned layers is a thickness measured at the mask width Wm being 50 μm.

In the selective growth of the above-mentioned MQW-SCH structure, the n $In_{0.806}Ga_{0.194}As_{0.632}P_{0.368}$ well layer was grown employing TBA and TBP having a V/III ratio of 90, and the $In_{0.810}Ga_{0.190}As_{0.405}P_{0.595}$ barrier layer and the $In_{0.810}Ga_{0.190}As_{0.405}P_{0.595}$ SCH layer were grown employing TBA and TBP having a V/III ratio of 4.

Figure 16:
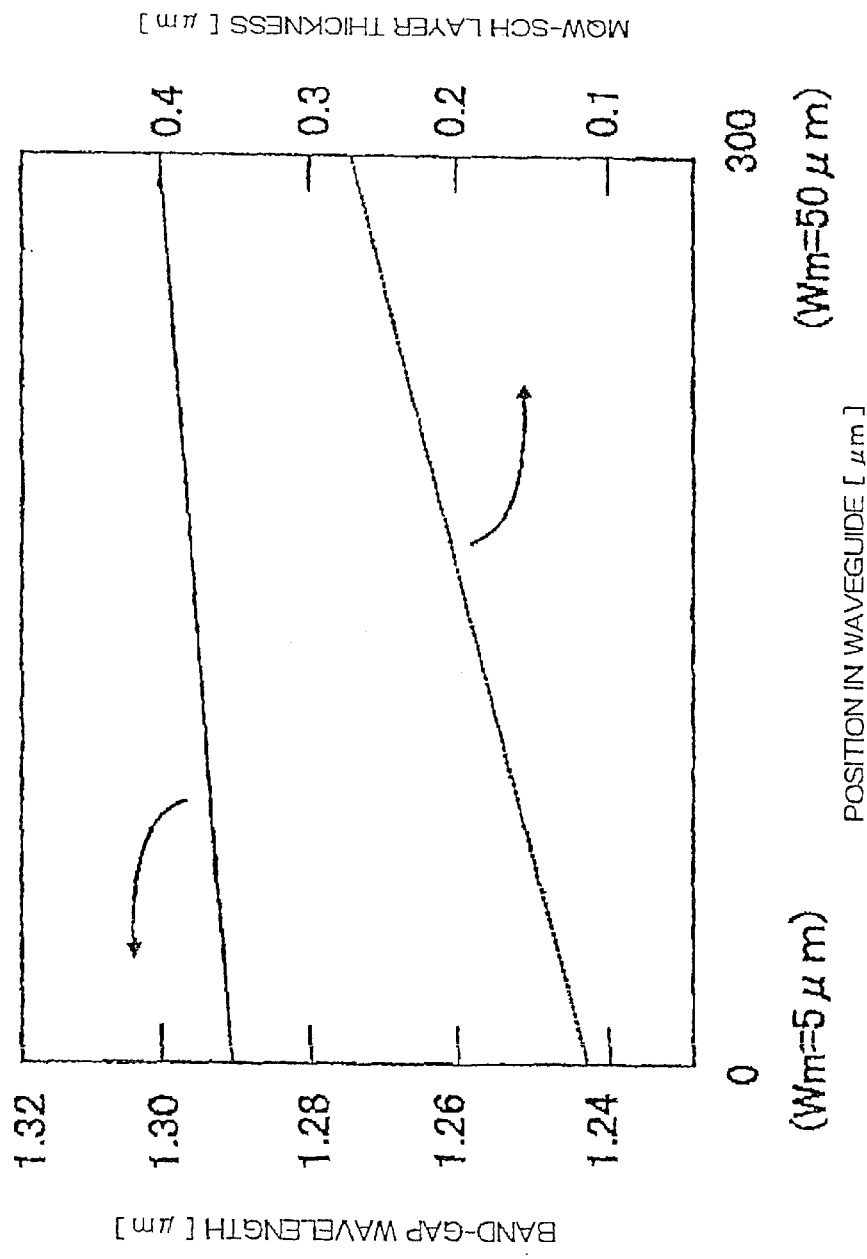
FIG. 16 is a graph showing a relation (a) a band-gap wavelength, a thickness of a MQW-SCH layer and (b) a waveguide position in the sixth and seventh embodiments.

FIG. 16 is a graph showing photoluminescence (PL) peak wavelength measured in the lengthwise direction of the 300 μm-long SSC-LD illustrated in FIG. 10, and a thickness of the MQW-SCH layer measured by means of a scanning electron microscope (SEM). The PL peak wavelength and the thickness at the mask width Wm being 50 μm are 1.300 μm and 0.273 μm, respectively, whereas the PL peak wavelength and the thickness at the mask width Wm being 5 μm are 1.290 μm and 0.108 μm, respectively.

Thereafter, as illustrated in FIGS. 11C to 11E, a current blocking structure, a clad layer, and a cap layer are formed by MOVPE selective growth, followed by the formation of electrodes, in the similar way as the third embodiment. Thus, there is obtained the semiconductor laser diode as illustrated in FIG. 10.

Flow rates of source gases employed for MOVPE selective growth of the well layer, barrier layer and SCH layer are as follows.

(a) the $In_{0.806}Ga_{0.194}As_{0.632}P_{0.368}$ well layer: TMI=44 cc/min, TEG=16 cc/min, TBA=26 cc/min, TBP=125 cc/min, V/III=90.
(b) the $In_{0.810}Ga_{0.190}As_{0.405}P_{0.595}$ barrier layer: TMI=284 cc/min, TEG=45.4 cc/min, TBA=1.5 cc/min, TBP= 33.3 cc/min, V/III=4.
(c) the $In_{0.810}Ga_{0.190}As_{0.405}P_{0.595}$ SCH layer: TMI=284 cc/min, TEG=45.4 cc/min, TBA=1.5 cc/min, TBP= 33.3 cc/min, V/III=4.

The thus formed semiconductor laser diode in accordance with the instant embodiment was cut out into a piece having a device length of 300 μm. A 30%-reflective coating and a 90%-reflective coating were applied to the front and rear end planes of the thus formed semiconductor laser diode, respectively, and then measurement was conducted. The results were as follows.

|                          | 25° C.    | 90° C.    |
|--------------------------|-----------|-----------|
| Laser oscillation wavelength | 1.31 μm | 1.33 μm |
| Threshold current        | 6.2 mA    | 15.7 mA   |
| Slope efficiency         | 0.54 W/A  | 0.43 W/A  |

Far field pattern (FFP) was also measured. A divergence angle at the rear end plane was 28°×31°, whereas a divergence angle at the front end plane was 9.5°×10.8°. Subsequently, a coupling characteristic with a flat ended single-mode fiber (1.3 μm zero dispersion), anti-reflective coating was applied to an end plane of which, was evaluated. When the semiconductor laser diode was got close to the fiber by a spacing of 10 μm, there was obtained the maximum coupling efficiency of −1.9 dB.

A theoretical yield in the number of devices to be obtained from a 2-inch wafer having gone through wafer process is 32,724, in which case it is supposed that a chip is 300 μm×200 μm in size. In the experiment, 27,440 devices exhibited at 25° C. that a threshold current was equal to or smaller than 8 mA, a slope efficiency was equal to or greater than 0.50 W/A, and a divergence angle is equal to or smaller than 11°×12°. Average values (±standard deviation) among the 27,440 devices exhibit extremely high uniformity as follows.

A threshold current: 6.57 mA±0.21 mA

A slope efficiency: 0.535 W/A±0.002 W/A

A divergence angle at the front end plane: (9.9°±0.78°)×(10.9°±0.70°)

[Seventh Embodiment]

FIGS. 10, 11A to 11E and 16 also illustrate an SSC-LD in accordance with the seventh embodiment. FIGS. 11A to 11E are cross-sectional views of the SSC-LD, illustrating respective step of a method of fabricating the same. FIG. 10 is a perspective view of the SSC-LD in accordance with the seventh embodiment.

A silicon dioxide ($SiO_2$) layer is formed on an n-InP substrate 101 having a (100) plane as a principal plane. The silicon dioxide layer is deposited by atmospheric CVD by a thickness of 100 nm. Then, the silicon dioxide layer is patterned to thereby form a pair of masks 102 in such a manner that a gap to be formed between the masks 102 is oriented in [011] direction, as illustrated in FIG. 11A.

The gap formed between the masks 102 has a width Wg of 1.5 μm, and each of the masks 102 has a width Wm successively varying from 50 μm to 5 μm. The SSC-LD is 300 μm long. A MQW-SCH optical waveguide comprising a first SCH layer 103, an MQW layer 104, and a second SCH layer 105 is formed by MOVPE selective growth onto the 1.5 μm-gap, as illustrated in FIG. 11B. A growth temperature is 625° C. Source materials used are trimethylindium, triethylgallium, diethylzinc, arsine, phosphine, TBA, TBP, and disilane.

The optical waveguide is constituted of the following layers:

(a) n-$In_{0.810}Ga_{0.190}As_{0.405}P_{0.595}$ SCH layer having a carrier concentration of $1 \times 10^{18}$ $cm^{-3}$ and a thickness of 70 nm;

(b) an undoped $In_{0.810}Ga_{0.190}As_{0.405}P_{0.595}$ SCH layer having a thickness of 30 nm;

(c) a multi-quantum well active layer consisting of five cycles of an undoped $In_{0.806}Ga_{0.194}As_{0.632}P_{0.368}$ well layer having a thickness of 5 nm and an $In_{0.810}Ga_{0.190}As_{0.405}P_{0.595}$ barrier layer having a thickness of 12 nm; and (d) an undoped $In_{0.810}Ga_{0.190}As_{0.405}P_{0.595}$ layer having a thickness of 100 nm.

The thickness of the above-mentioned layers is a thickness measured at the mask width Wm being 50 μm.

In the selective growth of the above-mentioned MQW-SCH structure, the $In_{0.806}Ga_{0.194}As_{0.632}P_{0.368}$ well layer was grown employing TBA and TBP having a V/III ratio of 90, and the $In_{0.810}Ga_{0.190}As_{0.405}P_{0.595}$ barrier layer and the $In_{0.810}Ga_{0.190}As_{0.405}P_{0.595}$ SCH layer were grown employing $AsH_3$ and $PH_3$.

FIG. 16 is a graph showing photoluminescence (PL) peak wavelength measured in the lengthwise direction of the 300 μm-long SSC-LD illustrated in FIG. 10, and a thickness of the MQW-SCH layer measured by means of a scanning electron microscope (SEM). The PL peak wavelength and the thickness at the mask width Wm being 50 μm are 1.300 μm and 0.273 μm, respectively, whereas the PL peak wavelength and the thickness at the mask width Wm being 5 μm are 1.290 μm and 0.108 μm, respectively.

Thereafter, as illustrated in FIGS. 11C to 11E, a current blocking structure, a clad layer, and a cap layer are formed by MOVPE selective growth, followed by the formation of electrodes, in the similar way as the third embodiment. Thus, there is obtained the semiconductor laser diode as illustrated in FIG. 10.

Flow rates of source gases employed for MOVPE selective growth of the well layer, barrier layer and SCH layer are as follows.

(a) the $In_{0.806}Ga_{0.194}As_{0.632}P_{0.368}$ well layer: TMI=44 cc/min, TEG=16 cc/min, TBA=26 cc/min, TBP=125 cc/min.

(b) the $In_{0.810}Ga_{0.190}As_{0.405}P_{0.595}$ barrier layer: TMI=284 cc/min, TEG=45.4 cc/min, $AsH_3$=7.20 cc/min, $PH_3$=125 cc/min.

(c) the $In_{0.810}Ga_{0.190}As_{0.405}P_{0.595}$ SCH layer: TMI=284 cc/min, TEG=45.4 cc/min, $AsH_3$=7.20 cc/min, PH,=125 cc/min.

The thus formed semiconductor laser diode in accordance with the instant embodiment was cut out into a piece having a device length of 300 μm. A 30%-reflective coating and a 90%-reflective coating were applied to the front and rear end planes of the thus formed semiconductor laser diode, respectively, and then measurement was conducted. The results were as follows.

|  | 25° C. | 90° C. |
| --- | --- | --- |
| Laser oscillation wavelength | 1.31 μm | 1.33 μm |
| Threshold current | 6.2 mA | 15.7 mA |
| Slope efficiency | 0.54 W/A | 0.43 W/A |

Far field pattern (FFP) was also measured. A divergence angle at the rear end plane was 28°×31°, whereas a divergence angle at the front end plane was 9.5°×10.8°. Subsequently, a coupling characteristic with a flat ended single-mode fiber (1.3 μm zero dispersion), anti-reflective coating was applied to an end plane of which, was evaluated. When the semiconductor laser diode was got close to the fiber by a spacing of 10 μm, there was obtained the maximum coupling efficiency of −1.9 dB.

A theoretical yield in the number of devices to be obtained from a 2-inch wafer having gone through wafer process is 32,724, in which case it is supposed that a chip is 300 μm×200 μm in size. In the experiment, 27,440 devices exhibited at 25° C. that a threshold current was equal to or smaller than 8 mA, a slope efficiency was equal to or greater than 0.50 W/A, and a divergence angle is equal to or smaller than 11°×12°. Average values (±standard deviation) among the 27,440 devices exhibit extremely high uniformity as follows.

A threshold current: 6.57 mA±0.21 mA

A slope efficiency: 0.535 W/A±0.002 W/A

A divergence angle at the front end plane: (9.9°±0.78°)×(10.9°±0.70°)

[Eighth Embodiment]

FIGS. 10, 11A to 11E and 17 also illustrate an SSC-LD in accordance with the eighth embodiment. FIGS. 11A to 11E are cross-sectional views of the SSC-LD, illustrating respective step of a method of fabricating the same. FIG. 10 is a perspective view of the SSC-LD in accordance with the eighth embodiment.

A silicon dioxide ($SiO_2$) layer is formed on an n-InP substrate 101 having a (100) plane as a principal plane. The silicon dioxide layer is deposited by atmospheric CVD by a thickness of 100 nm. Then, the silicon dioxide layer is patterned to thereby form a pair of masks 102 in such a manner that a gap to be formed between the masks 102 is oriented in [011] direction, as illustrated in FIG. 11A.

The gap formed between the masks 102 has a width Wg of 1.5 μm, and each of the masks 102 has a width Wm successively varying from 50 μm to 5 μm. The SSC-LD is 300 μm long. A MQW-SCH optical waveguide comprising a first SCH layer 103, an MQW layer 104, and a second SCH layer 105 is formed by MOVPE selective growth onto the 1.5 μm-gap, as illustrated in FIG. 11B. A growth temperature is 625° C. Source materials used are trimethylindium, triethylgallium, diethylzinc, arsine, phosphine, TBA, TBP, and disilane.

The optical waveguide is constituted of the following layers:

(a) n-$In_{0.810}Ga_{0.190}As_{0.405}P_{0.595}$ SCH layer having a carrier concentration of $1\times10^{18}$ $cm^{-3}$ and a thickness of 70 nm;

(b) an undoped $In_{0.810}Ga_{0.190}As_{0.405}P_{0.595}$ SCH layer having a thickness of 30 nm;

(c) a multi-quantum well active layer consisting of five cycles of an undoped $In_{0.806}Ga_{0.194}As_{0.632}P_{0.368}$ well layer having a thickness of 5 nm and an $In_{0.810}Ga_{0.190}As_{0.405}P_{0.595}$ barrier layer having a thickness of 12 nm; and (d) an undoped $In_{0.810}Ga_{0.190}As_{0.405}P_{0.595}$ SCH layer having a thickness of 100 nm.

The thickness of the above-mentioned layers is a thickness measured at the mask width Wm being 50 μm.

In the selective growth of the above-mentioned MQW-SCH structure, the $In_{0.806}Ga_{0.194}As_{0.632}P_{0.368}$ well layer was grown under a growth pressure of 30 hPa, employing TBA and TBP having a V/III ratio of 90, the $In_{0.810}Ga_{0.190}As_{0.405}P_{0.595}$ barrier layer was grown under a growth pressure of 30 hPa, employing $AsH_3$ and $PH_3$, and the $In_{0.810}Ga_{0.190}As_{0.405}P_{0.595}$ SCH layer was grown under a growth pressure of 250 hPa, employing $AsH_3$ and $PH_3$.

Figure 17:
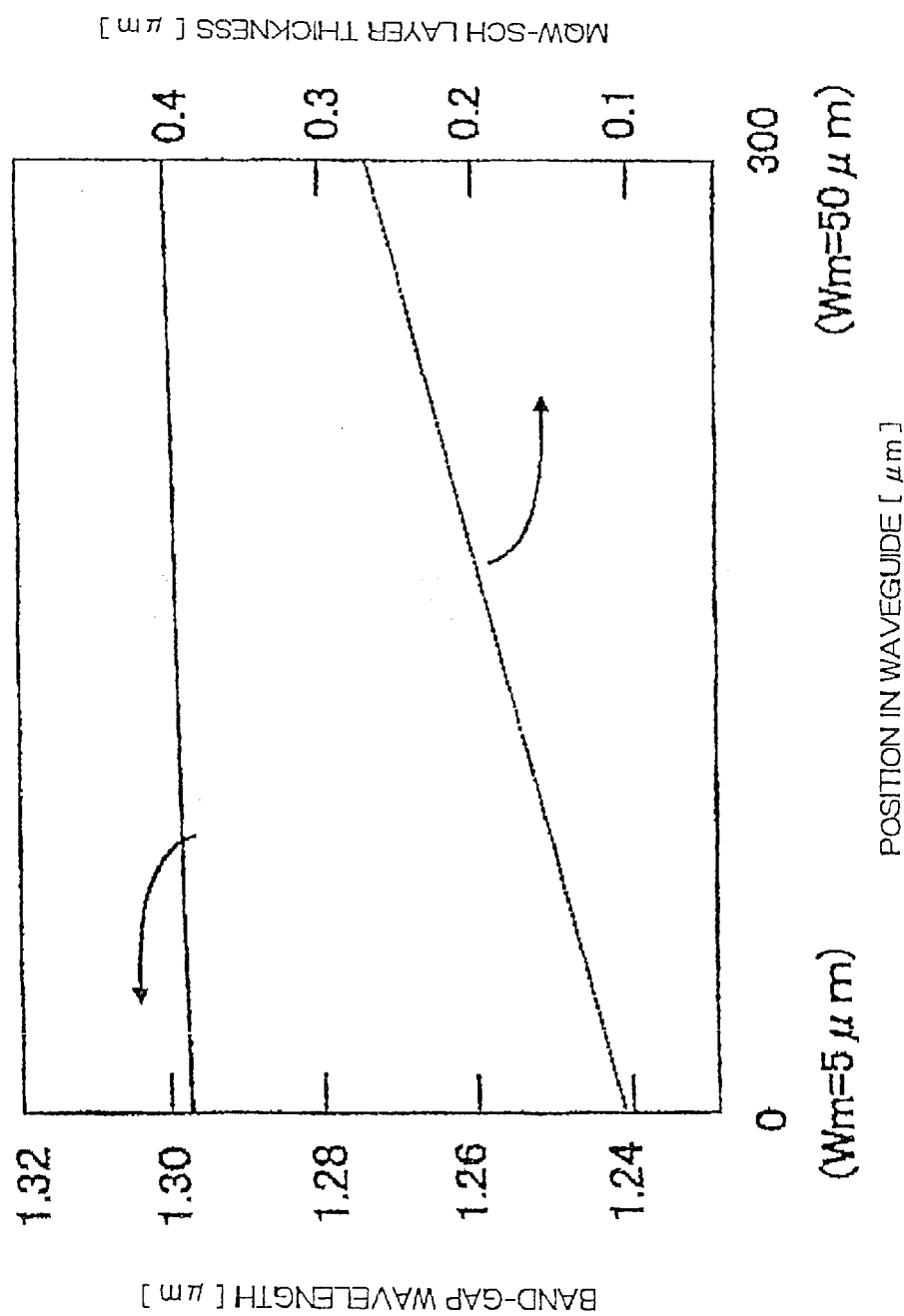
FIG. 17 is a graph showing a relation (a) a band-gap wavelength, a thickness of a MQW-SCH layer and (b) a waveguide position in the eighth embodiment.

FIG. 17 is a graph showing photoluminescence (PL) peak wavelength measured in the lengthwise direction of the 300 μm-long SSC-LD illustrated in FIG. 10, and a thickness of the MQW-SCH layer measured by means of a scanning electron microscope (SEM). The PL peak wavelength and the thickness at the mask width Wm being 50 μm are 1.300 μm and 0.273 μm, respectively, whereas the PL peak wavelength and the thickness at the mask width Wm being 5 μm are 1.290 μm and 0.104 μm, respectively.

Thereafter, as illustrated in FIGS. 11C to 11E, a current blocking structure, a clad layer, and a cap layer are formed by MOVPE selective growth, followed by the formation of electrodes, in the similar way as the third embodiment. Thus, there is obtained the semiconductor laser diode as illustrated in FIG. 10.

Flow rates of source gases employed for MOVPE selective growth of the well layer, barrier layer and SCH layer are as follows.

(a) the $In_{0.806}Ga_{0.194}As_{0.405}P_{0.595}$ well layer: TMI=44 cc/min, TEG=16 cc/min, TBA=26 cc/min, TBP=125 cc/min, growth pressure=250 hPa.

(b) the $In_{0.810}Ga_{0.190}As_{0.405}P_{0.595}$ barrier layer: TMI=284 cc/min, TEG=45.4 cc/min, $AsH_3$=7.20 cc/min, $PH_3$= 125 cc/min, growth pressure=250 hPa.

(c) the $In_{0.810}Ga_{0.190}As_{0.405}P_{0.595}$ SCH layer: TMI=284 cc/min, TEG=45.4 cc/min, $AsH_3$=7.20 cc/min, $PH_3$= 125 cc/min, growth pressure=30 hPa.

The thus formed semiconductor laser diode in accordance with the instant embodiment was cut out into a piece having a device length of 300 μm. A 30%-reflective coating and a 90%-reflective coating were applied to the front and rear end planes of the thus formed semiconductor laser diode, respectively, and then measurement was conducted. The results were as follows.

|  | 25° C. | 90° C. |
| --- | --- | --- |
| Laser oscillation wavelength | 1.31 μm | 1.33 μm |
| Threshold current | 5.2 mA | 14.1 mA |
| Slope efficiency | 0.58 W/A | 0.46 W/A |

Far field pattern (FFP) was also measured. A divergence angle at the rear end plane was 28°×31°, whereas a divergence angle at the front end plane was 9.0°×10.1°. Subsequently, a coupling characteristic with a flat ended single-mode fiber (1.3 μm zero dispersion), anti-reflective coating was applied to an end plane of which, was evaluated. When the semiconductor laser diode was got close to the fiber by a spacing of 10 μm, there was obtained the maximum coupling efficiency of −1.8 dB.

A theoretical yield in the number of devices to be obtained from a 2-inch wafer having gone through wafer process is 32,724, in which case it is supposed that a chip is 300 μm×200 μm in size. In the experiment, 29,640 devices exhibited at 25° C. that a threshold current was equal to or smaller than 7 mA, a slope efficiency was equal to or greater than 0.50 W/A, and a divergence angle is equal to or smaller than 10.5°×11.5°. Average values (±standard deviation) among the 29,640 devices exhibit extremely high uniformity as follows.

A threshold current: 5.41 mA±0.19 mA

A slope efficiency: 0.565 W/A±0.002 W/A

A divergence angle at the front end plane: (9.2°±0.68°)× (10.1°±0.55°)

[Ninth Embodiment]

Figure 18:
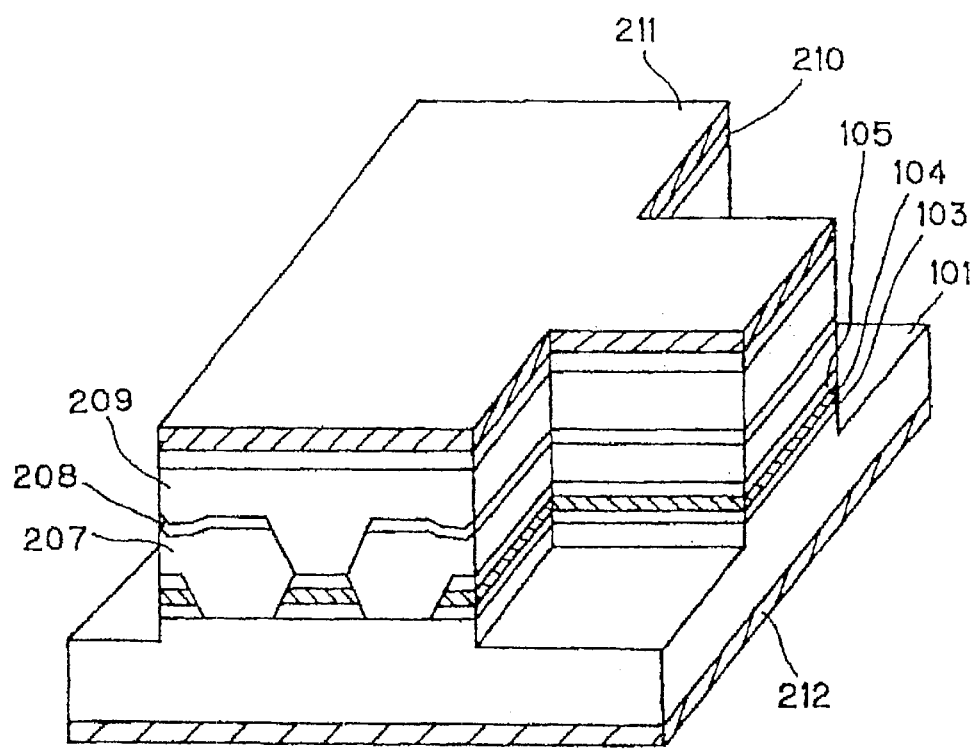
FIG. 18 is a perspective view illustrating an optical semiconductor device in accordance with the ninth embodiment of the invention.

FIGS. 11A, 11B, 12, 18 and 19A to 19C illustrate an SSC-pin-PD in accordance with the ninth embodiment. FIGS. 11A, 11B and 19A to 19C are cross-sectional views of the SSC-pin-PD, illustrating respective step of a method of fabricating the same. FIG. 18 is a perspective view of the SSC-pin-PD in accordance with the ninth embodiment.

A silicon dioxide ($SiO_2$) layer is formed on an n-InP substrate 101 having a (100) plane as a principal plane. The silicon dioxide layer is deposited by atmospheric chemical vapor deposition (CVD) by a thickness of 100 nm. Then, the silicon dioxide layer is patterned to thereby form a pair of masks 102 in such a manner that a gap to be formed between the masks 102 is oriented in [011] direction, as illustrated in FIG. 11A.

The gap formed between the masks 102 has a width Wg of 1.5 μm, and each of the masks 102 has a width Wm successively varying from 50 μm to 5 μm. The illustrated SSC-pin-LD is 300 μm long. A MQW-SCH optical waveguide comprising a first SCH layer 103, an MQW layer 104, and a second SCH layer 105 is formed by MOVPE selective growth onto the 1.5 μm-gap, as illustrated in FIG. 11B. A growth temperature is 625 ° C. Source materials used are trimethylindium [$In(CH_3)_3$], triethylgallium [$Ga(C_2H_5)_3$], diethylzinc [$Zn(C_2H_5)_2$], arsine [$AsH_3$], phosphine[$PH_3$], and disilane [$Si_2H_6$].

The optical waveguide is constituted of the following layers:

(a) n-$In_{0.810}Ga_{0.190}As_{0.405}P_{0.595}$ SCH layer having a carrier concentration of $1\times10^{18}$ $cm^{-3}$ and a thickness of 70 nm;

(b) an undoped $In_{0.810}Ga_{0.190}As_{0.405}P_{0.595}$ SCH layer having a thickness of 30 nm;

(c) a multi-quantum well active layer consisting of five cycles of an undoped $In_{0.806}Ga_{0.194}As_{0.632}P_{0.368}$ well layer having a thickness of 5 nm and an $In_{0.810}Ga_{0.190}As_{0.405}P_{0.595}$ barrier layer having a thickness of 8 nm; and (d) an undoped $In_{0.810}Ga_{0.190}As_{0.405}P_{0.595}$ SCH layer having a thickness of 100 nm.

The thickness of the above-mentioned layers is a thickness measured at the mask width Wm being 50 μm.

In the selective growth of the above-mentioned MQW-SCH structure, the $In_{0.806}Ga_{0.194}As_{0.632}P_{0.368}$ well layer and the $In_{0.810}Ga_{0.190}As_{0.405}P_{0.595}$ barrier layer were grown under a growth pressure of 30 hPa, and the $In_{0.810}Ga_{0.190}As_{0.405}P_{0.595}$ SCH layer was grown under a growth pressure of 250 hPa.

The above-mentioned MQW-SCH structure is the same as that of the third embodiment, and photoluminescence (PL) peak wavelength measured in the lengthwise direction of the 300 μm-long SSC-pin-PD, and a thickness of the MQW-SCH layer measured by means of a scanning electron microscope (SEM) are the same as those illustrated in FIG. 12.

Figure 19A:
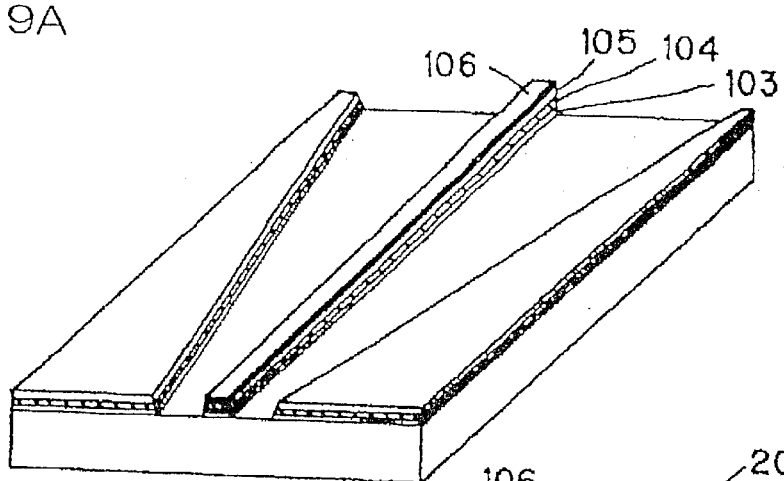
FIGS. 19A to 19C are perspective views of an optical semiconductor device in accordance with the ninth and tenth embodiments of the invention, illustrating respective steps of a method of fabricating the same.

Then, the $SiO_2$ masks 102 are removed, followed by formation of a mask 106 onto the MQW-SCH structure, as illustrated in FIG. 19A. The mask 106 is made of silicon dioxide ($SiO_2$).

Figure 19B:
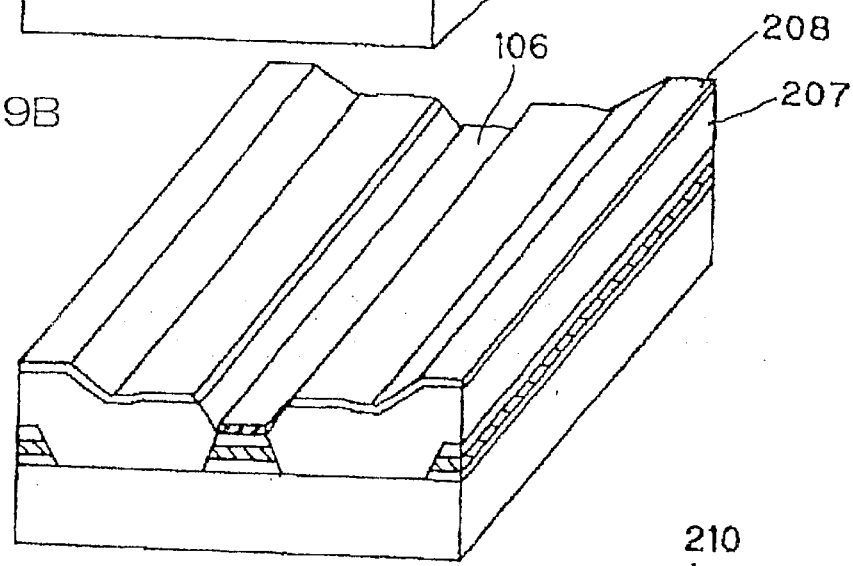

Then, as illustrated in FIG. 19B, the MQW-SCH structure is buried at opposite sides thereof with the following layers by MOVPE selective growth:

(a) Fe-doped, highly resistive InP layer 207 having a thickness of 1.5 μm; and (b) n-InP layer 208 having a carrier concentration of $7\times10^{17}$ cm$^{-3}$ and a thickness of 0.20 μm.

Figure 19C:
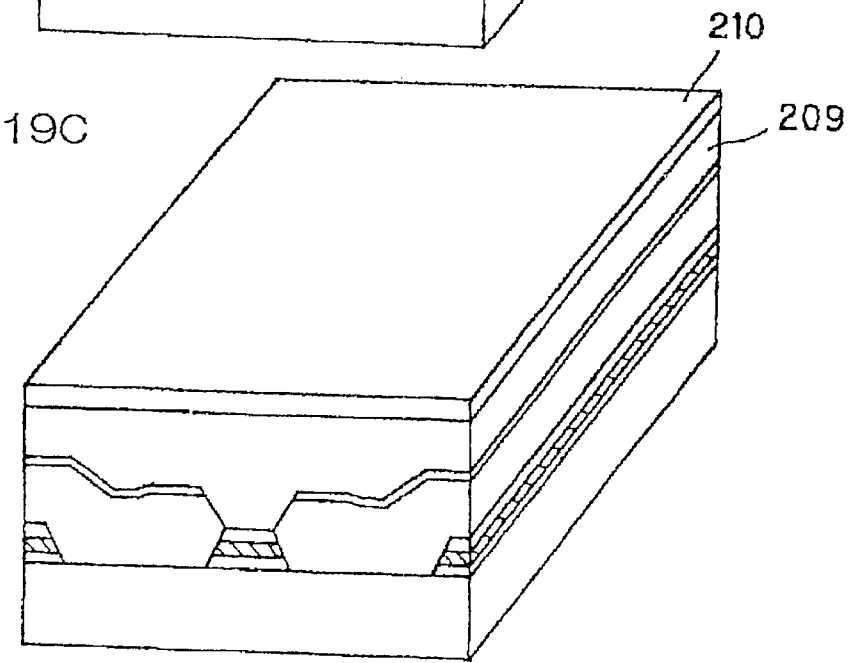

Then, the $SiO_2$ mask 106 formed onto the MQW-SCH structure is removed, and thereafter, there are epitaxially grown p-InP clad layer 209 having a carrier concentration of $1\times10^{18}$ cm$^{-3}$ and a thickness of 3.0 μm and p$^+$-$In_{0.53}Ga_{0.47}As$ cap layer 210 having a carrier concentration of $6\times10^{18}$ cm$^{-3}$ and a thickness of 0.3 μm over the product, as illustrated in FIG. 19C.

Flow rates of source gases employed for MOVPE selective growth of InP, InGaAsP and InGaAs are same as those of the third embodiment.

After MOVPE growth has been completed, a p-side electrode 211 is formed over the cap layer 210, and an n-side electrode 212 is formed onto a lower surface of the n-InP substrate 101. Then, the product is shaped into a mesa for reducing parasitic capacity so that regions for bonding pads remain as they are. The thus formed SSC-pin-PD in accordance with the instant embodiment is illustrated in FIG. 18.

The thus formed SSC-pin-PD was cut out into a piece having a device length of 300 μm. An anti-reflection coating having a reflectance equal to or smaller than 1%, and a 90%-reflective coating were applied to the front and rear end planes of the SSC-pin-PD, respectively, and then measurement was conducted. The PD characteristic was evaluated by getting a flat ended single-mode fiber (1.3 μm zero dispersion) close to the SSC-pin-PD by 10 μm, and emitting lights having a wavelength of 1.30 μm into the SSC-pin-LD. As a result, there was obtained an external differential quantum efficiency of 60%, in view of which a coupling efficiency is estimated −2.2 dB. Moreover, a 3 dB bandwidth was 12 GHz, and a dark current was 3.2 nA when 2V-biased.

A theoretical yield in the number of devices to be obtained from a 2-inch wafer having gone through wafer process is 32,724, in which case it is supposed that a chip is 300 μm×200 μm in size. In the experiment, 26,520 devices exhibited, when 2V-biased, that a 3 dB bandwidth was equal to or greater than 10 GHz, a dark current was equal to or smaller than 15 nA, and an external differential quantum efficiency was equal to or greater than 50%. Average values (±standard deviation) among the 26,520 devices exhibit extremely high uniformity as follows.

3 dB bandwidth: 11.5 GHz±0.85 GHz

Dark current: 4.2 nA±0.12 nA

External differential quantum efficiency: 34%±3.2%

The above-mentioned method of fabricating an SSC-pin-PD is the same as that of the third embodiment. However, it should be noted that the fourth to eighth embodiments may be applied to fabrication of the SSC-pin-PD.

[Tenth Embodiment]

Figure 20A:
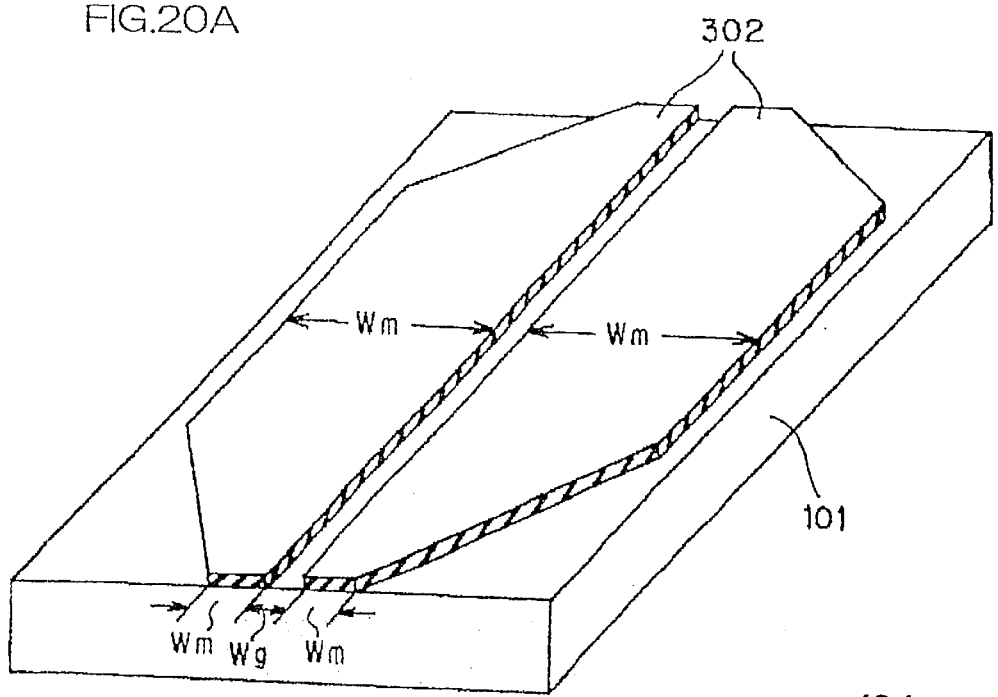
FIGS. 20A and 20B are perspective views of an optical semiconductor device in accordance with the tenth and eleventh embodiments of the invention, illustrating respective steps of a method of fabricating the same.
Figure 20B:
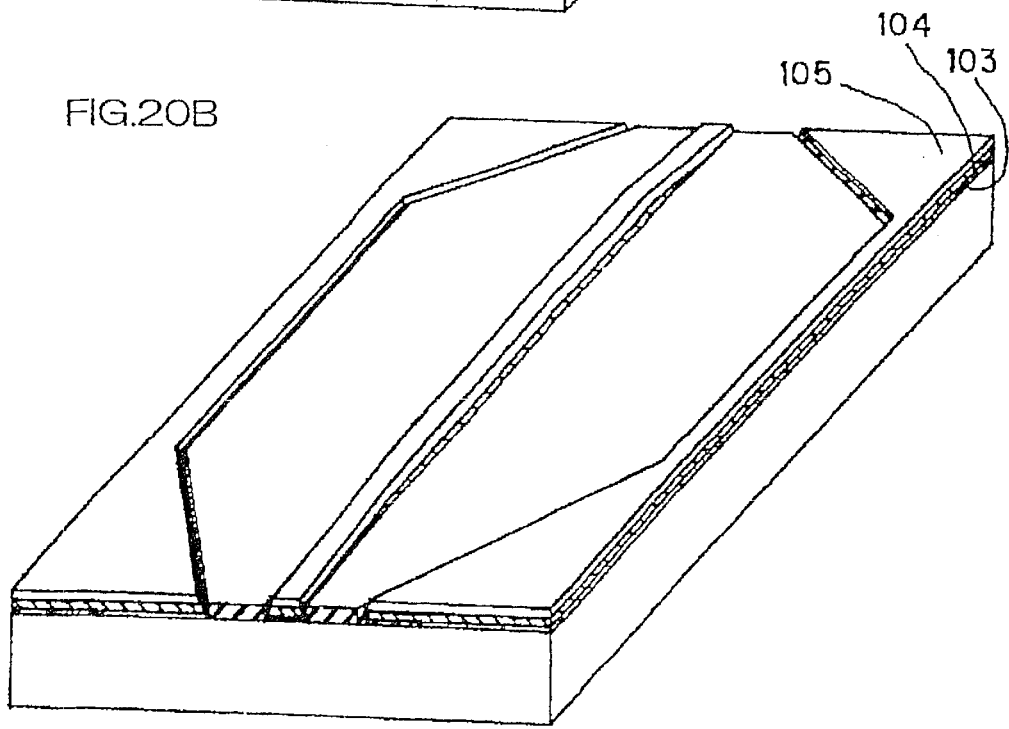
Figure 21:
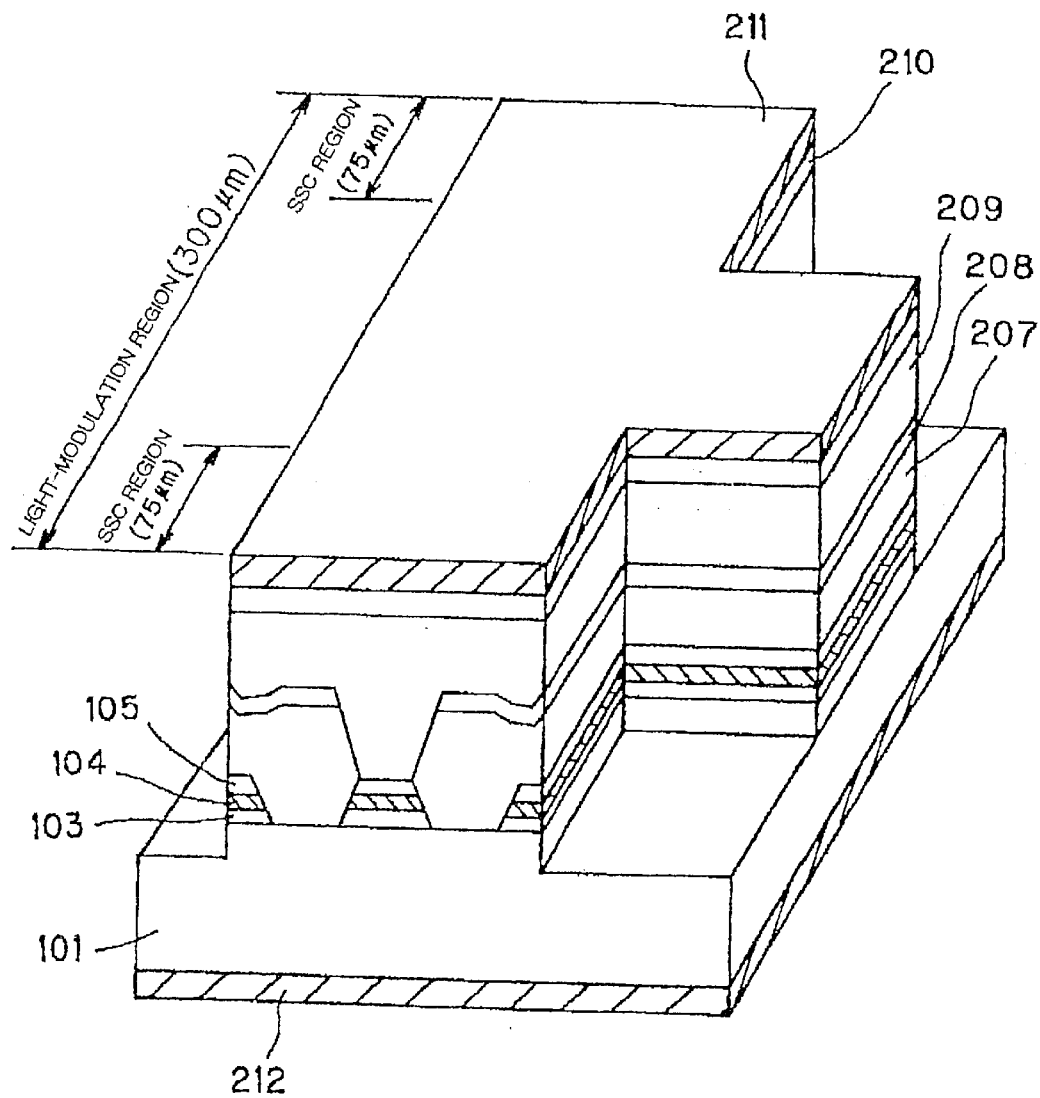
FIG. 21 is a perspective view illustrating an optical semiconductor device in accordance with the tenth embodiment of the invention.

FIGS. 19A to 19C, 20A, 20B, 21 and 22 illustrate an SSC-modulator in accordance with the tenth embodiment. FIGS. 20A, 20B and 19A to 19C are cross-sectional views of the SSC-modulator, illustrating respective step of a method of fabricating the same. FIG. 21 is a perspective view of the SSC-modulator in accordance with the tenth embodiment.

A silicon dioxide ($SiO_2$) layer is formed on an n-InP substrate 101 having a (100) plane as a principal plane. The silicon dioxide layer is deposited by atmospheric chemical vapor deposition (CVD) by a thickness of 100 nm. Then, the silicon dioxide layer is patterned to thereby form a pair of masks 302 in such a manner that a gap to be formed between the masks 302 is oriented in [011] direction, as illustrated in FIG. 20A.

The gap formed between the masks 302 has a width Wg of 1.5 μm, and each of the masks 302 is comprised of a central section having a width Wm of 50 μm and a length of 150 μm, and two tapered sections connecting to the central section at its ends and having a width varying from 50 μm to 5 μm and a length of 75 m. Hence, the illustrated SSC-modulator is 300 μm long. A MQW-SCH optical waveguide comprising a first SCH layer 103, an MQW layer 104, and a second SCH layer 105 is formed by MOVPE selective growth onto the 1.5 μm-gap, as illustrated in FIG. 20B. A growth temperature is 625° C. Source materials used are trimethylindium [$In(CH_3)_3$], triethylgallium [$Ga(C_2H_5)_3$], diethylzinc [$Zn(C_2H_5)_2$], arsine [$AsH_3$], phosphine [$PH_3$], and disilane [$Si_2H_6$].

The optical waveguide is constituted of the following layers:

(a) n-$In_{0.810}Ga_{0.190}As_{0.405}P_{0.595}$ SCH layer having a carrier concentration of $1\times10^{18}$ cm$^{-3}$ and a thickness of 70 nm;

(b) an undoped $In_{0.810}Ga_{0.190}As_{0.405}P_{0.595}$ SCH layer having a thickness of 30 nm;

(c) a multi-quantum well active layer consisting of eight cycles of an undoped $In_{0.806}Ga_{0.194}As_{0.632}P_{0.368}$ well layer having a thickness of 5 nm and an $In_{0.810}Ga_{0.190}As_{0.405}P_{0.595}$ barrier layer having a thickness of 8 nm; and (d) an undoped $In_{0.810}Ga_{0.190}As_{0.405}P_{0.595}$ SCH layer having a thickness of 100 nm.

The thickness of the above-mentioned layers is a thickness measured at the mask width Wm being 50 μm.

In the selective growth of the above-mentioned MQW-SCH structure, the $In_{0.806}Ga_{0.194}As_{0.632}P_{0.368}$ well layer and the $In_{0.810}Ga_{0.190}As_{0.405}P_{0.595}$ barrier layer were grown under a growth pressure of 30 hPa, and the $In_{0.810}Ga_{0.190}As_{0.405}P_{0.595}$ SCH layer was grown under a growth pressure of 250 hPa.

Figure 22:
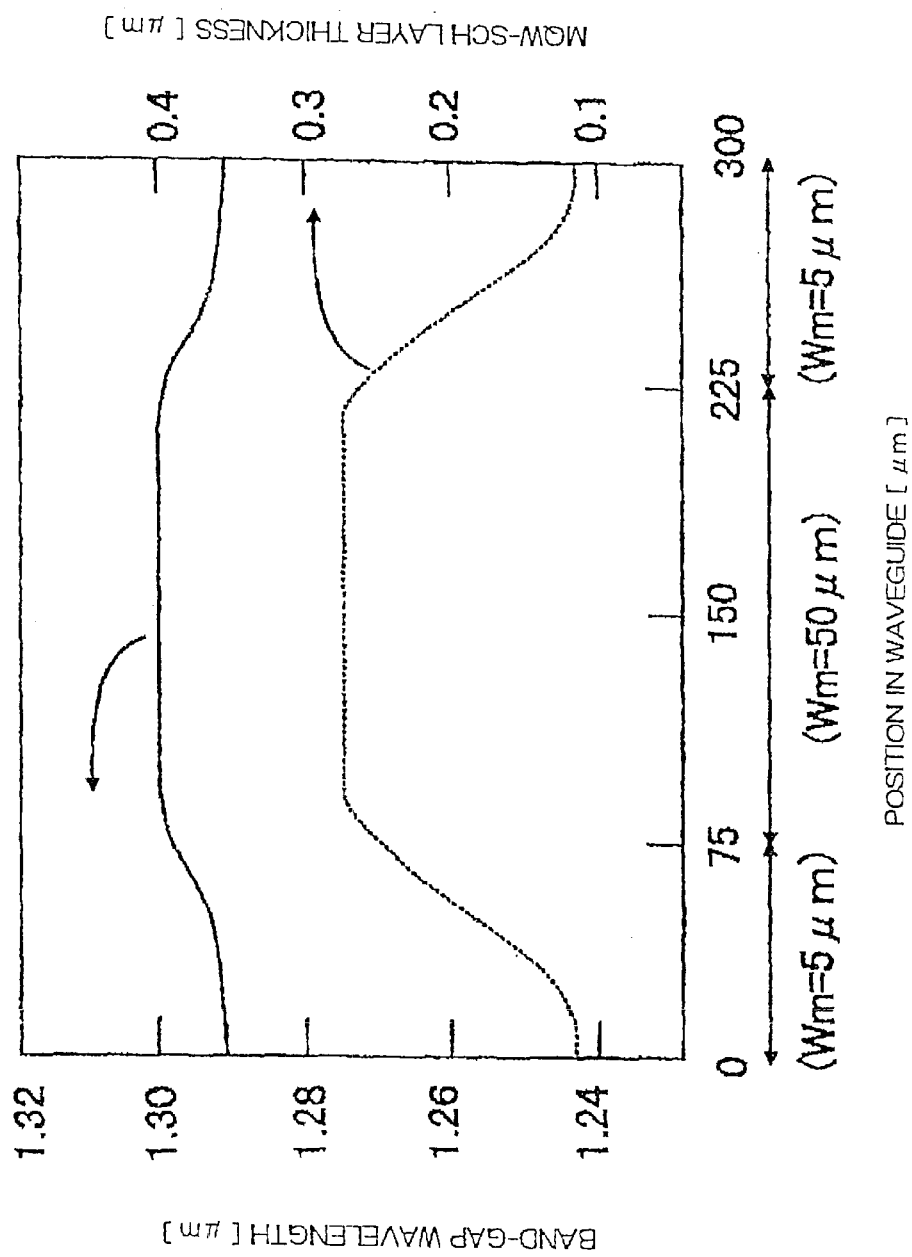
FIG. 22 is a graph showing a relation (a) a band-gap wavelength, a thickness of a MQW-SCH layer and (b) a waveguide position in the tenth and eleventh embodiments.

The above-mentioned MQW-SCH structure is the same as the MQW-SCH structure of the third embodiment except the MQW-SCH structure in accordance with the instant embodiment has the eight cycles of the well and barrier layers. FIG. 22 is a graph showing photoluminescence (PL) peak wavelength measured in the lengthwise direction of the 300 μm-long SSC-modulator, and a thickness of the MQW-SCH layer measured by means of a scanning electron microscope (SEM). The PL peak wavelength and the thickness at the central section where the mask width Wm is 50 μm are 1.30 μm and 0.27 μm, respectively, whereas the PL peak wavelength and the thickness at the opposite ends where the mask width Wm is 5 μm are 1.29 μm and 0.11 μm, respectively.

Then, as illustrated in FIG. 19B, the MQW-SCH structure is buried at opposite sides thereof with the layers 207 and 208 by MOVPE selective growth. Then, the $SiO_2$ mask 106 formed onto the MQW-SCH structure is removed, and thereafter, there are epitaxially grown the p-InP clad layer 209 and the $p^+\text{-}In_{0.53}Ga_{0.47}As$ cap layer 210 over the product, as illustrated in FIG. 19C.

Flow rates of source gases employed for MOVPE selective growth of InP, InGaAsP and InGaAs are same as those of the third embodiment.

After MOVPE growth has been completed, n- and p-side electrodes are formed, and the product is mesa-etched. Thus, there is fabricated the SSC-modulator as illustrated in FIG. 21.

The thus formed SSC-modulator was cut out into a piece having a device length of 300 μm. An anti-reflection coating having a reflectance equal to or smaller than 0.1% was applied to the front and rear end planes of the SSC-modulator, and then measurement was conducted. An insertion loss in fiber to fiber was measured by getting a flat ended single-mode fiber (1.3 μm zero dispersion) close to the SSC-modulator by 10 μm, and emitting lights having a wavelength of 1.35 μm into the SSC-modulator. The measured insertion loss in fiber to fiber was 5.6 dB. Moreover, a 3 dB bandwidth was 12 GHz, and an extinction ratio was 15 dB, when 2V-biased.

A theoretical yield in the number of devices to be obtained from a 2-inch wafer having gone through wafer process is 21,816, in which case it is supposed that a chip is 300 μm×300 μm in size. In the experiment, 19,480 devices exhibited, when 2V-biased, that a 3 dB bandwidth was equal to or greater than 10 GHz, an extinction ratio was equal to or greater than 13 dB, and an insertion loss in fiber to fiber was equal to or smaller than 6.5 dB. Average values (±standard deviation) among the 19,480 devices exhibit extremely high uniformity as follows.

3 dB bandwidth: 11.5 GHz±0.85 GHz

Extinction ratio: 14 dB±1.2 dB

Insertion loss in fiber to fiber: 5.9 dB±0.3 dB

The above-mentioned method of fabricating an SSC-modulator is the same as that of the third embodiment. However, it should be noted that the fourth to eighth embodiments might be applied to fabrication of the SSC-modulator.

[Eleventh Embodiment]

Figure 23:
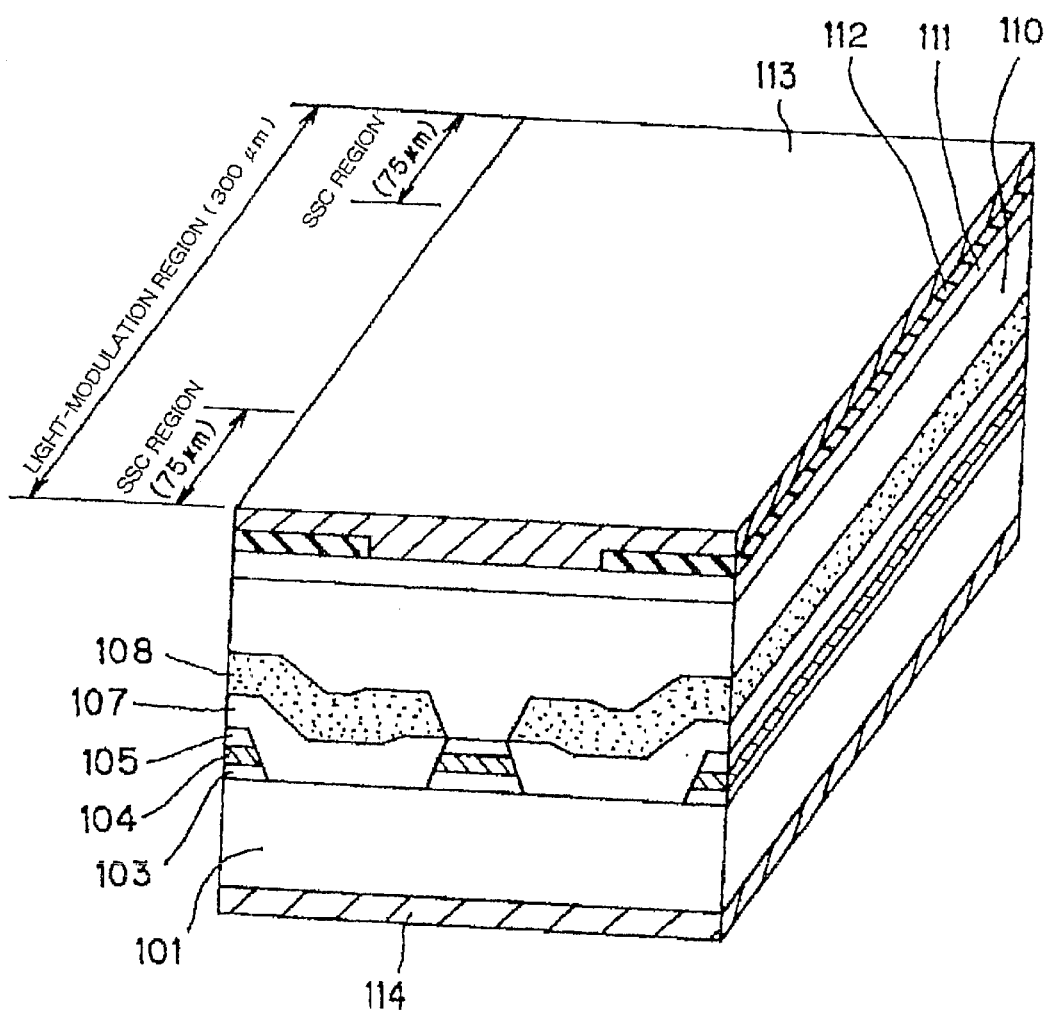
FIG. 23 is a perspective view illustrating an optical semiconductor device in accordance with the eleventh embodiment of the invention.

FIGS. 11C to 11E, 20A, 20B, 22 and 23 illustrate an SSC-amplifier in accordance with the eleventh embodiment. FIGS. 20A, 20B and 11C to 11E are cross-sectional views of the SSC-amplifier, illustrating respective step of a method of fabricating the same. FIG. 23 is a perspective view of the SSC-amplifier in accordance with the eleventh embodiment.

A silicon dioxide ($SiO_2$) layer is formed on an n-InP substrate 101 having a (100) plane as a principal plane. The silicon dioxide layer is deposited by atmospheric chemical vapor deposition (CVD) by a thickness of 100 nm. Then, the silicon dioxide layer is patterned to thereby form a pair of masks 302 in such a manner that a gap to be formed between the masks 302 is oriented in [011] direction, as illustrated in FIG. 20A.

The gap formed between the masks 302 has a width Wg of 1.5 μm, and each of the masks 302 is comprised of a central section having a width Wm of 50 μm and a length of 150 μm, and two tapered sections connecting to the central section at its ends and having a width varying from 50 μm to 5 μm and a length of 75 m. Hence, the illustrated SSC-modulator is 300 μm long. A MQW-SCH optical waveguide comprising a first SCH layer 103, an MQW layer 104, and a second SCH layer 105 is formed by MOVPE selective growth onto the 1.5 μm-gap, as illustrated in FIG. 20B. A growth temperature is 625° C. Source materials used are trimethylindium $[In(CH)_3]$, triethylgallium $[Ga(C_2H_5)_3]$, diethylzinc $[Zn(C_2H_5)_2]$, arsine $[AsH_3]$, phosphine $[PH_3]$, and disilane $[Si_2H_6]$.

The optical waveguide is constituted of the following layers:

(a) $n\text{-}In_{0.810}Ga_{0.190}As_{0.405}P_{0.595}$ SCH layer having a carrier concentration of $1\times10^{18}$ $cm^{-3}$ and a thickness of 70 nm;

(b) an undoped $In_{0.810}Ga_{0.190}As_{0.405}P_{0.595}$ SCH layer having a thickness of 30 nm;

(c) a multi-quantum well active layer consisting of eight cycles of an undoped $In_{0.806}Ga_{0.194}As_{0.632}P_{0.368}$ well layer having a thickness of 5 nm and an $In_{0.810}Ga_{0.190}As_{0.405}P_{0.595}$ barrier layer having a thickness of 8 nm; and (d) an undoped $In_{0.810}Ga_{0.190}As_{0.405}P_{0.595}$ SCH layer having a thickness of 100 nm.

The thickness of the above-mentioned layers is a thickness measured at the mask width Wm being 50 μm.

In the selective growth of the above-mentioned MQW-SCH structure, the $In_{0.806}Ga_{0.194}As_{0.632}P_{0.368}$ well layer and the $In_{0.810}Ga_{0.190}As_{0.405}P_{0.595}$ barrier layer were grown under a growth pressure of 30 hPa, and the $In_{0.810}Ga_{0.190}As_{0.405}P_{0.595}$ SCH layer was grown under a growth pressure of 250 hPa.

The above-mentioned MQW-SCH structure is the same as the MQW-SCH structure of the tenth embodiment. FIG. 22 is a graph showing photoluminescence (PL) peak wavelength measured in the lengthwise direction of the 300 μm-long SSC-amplifier, and a thickness of the MQW-SCH layer measured by means of a scanning electron microscope (SEM). The PL peak wavelength and the thickness at the central section where the mask width Wm is 50 μm are 1.30 μm and 0.27 μm, respectively, whereas the PL peak wavelength and the thickness at the opposite ends where the mask width Wm is 5 μm are 1.29 μm and 0.11 μm, respectively.

Then, the MQW-SCH structure is buried at opposite sides thereof with the layers by MOVPE selective growth in the same manner as the third embodiment, as illustrated in FIGS. 11D and 11E, followed by the formation of n-and p-side electrodes. Thus, there is fabricated the SSC-amplifier as illustrated in FIG. 23.

The thus formed SSC-amplifier was cut out into a piece having a device length of 300 μm. An anti-reflection coating having a reflectance equal to or smaller than 0.1% was applied to the front and rear end planes of the SSC-amplifier, and then measurement was conducted. An insertion loss in fiber to fiber was measured by getting a flat ended single-mode fiber (1.3 μm zero dispersion) close to the SSC-amplifier by 10 μm, and emitting lights having a wavelength of 1.30 μm into the SSC-amplifier. The measured insertion loss in fiber to fiber was 5.6 dB. A fiber output gain obtained when a current of 50 mA was introduced into the SSC-amplifier was 27 dB.

A theoretical yield in the number of devices to be obtained from a 2-inch wafer having gone through wafer process is 26,179, in which case it is supposed that a chip is 300 µm×250 µm in size. In the experiment, 20,470 devices exhibited that an insertion loss in fiber to fiber was equal to or smaller than 6.5 dB, and a fiber output gain obtained when receiving 50 mA-input was equal to or greater than 25 dB. Average values (±standard deviation) among the 20,470 devices exhibit extremely high uniformity as follows.

Insertion loss: 6.1 dB±0.25 dB

Fiber output gain: 26 dB±1.2 dB

The above-mentioned method of fabricating an SSC-amplifier is the same as that of the third embodiment. However, it should be noted that the fourth to eighth embodiments might be applied to fabrication of the SSC-amplifier.

In the above-mentioned embodiments, only InGaAsP/InGaAsP system MQW structure having 1.3 µm band is explained. However, it should be noted that a wavelength band is not to be limited to 1.3 µm band. In addition, the MQW structure is not to be limited to the InGaAsP/InGaAsP MQW structure, but may have any structure such as InGaAs/InGaAsP system MQW structure, InAlGaAs system MQW structure, and InAsP system MQW structure, if it could be achieved by MOVPE selective growth.

As having been described in connection with the preferred embodiments, an optical semiconductor device in accordance with the present invention includes a waveguide having a thickness varying in a lengthwise direction of the waveguide, and also includes a quantum well structure including a well layer having a thickness almost constant in an entire length of the waveguide. Hence, the optical semiconductor device can have an optical gain in its entire length as well as a function of spot-size conversion. Hence, the present invention makes it possible to enhance high temperature operation characteristic in an SSC-LD and an SSC-amplifier, and to accomplish lower threshold value characteristic and higher gain amplification.

Moreover, since the present invention makes it possible to conduct photoelectric transfer and light modulation in an entire length of a waveguide in an optical device having a function of spot-size conversion, a higher quantum efficiency and a higher extinction ratio could be obtained in an SSC-pin-PD and an SSC-modulator.

The present invention makes it no longer necessary to form a region only for conducting spot-size conversion therein. As a result, an entire region of a waveguide serves as an active region, which ensures that a waveguide in an SSC-LD, SSC-pin-PD, SSC-modulator and SSC-amplifier may be formed to be almost equal in length to a conventional device having no function of spot-size conversion. Specifically, the waveguide in an optical device in accordance with the invention can be formed about 300 µm in length. Accordingly, a device yield per a unit area or per a wafer, namely the number of devices obtained from one wafer, can be significantly enhanced.

The inventive method of fabricating an optical semiconductor device makes it possible to form a waveguide by single MOVPE selective growth. Since it is not necessary in the inventive method to carry out steps of etching semiconductor layers, the method is superior in controllability and reproducibility, and would enhance a fabrication yield.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-325370 filed on Dec. 5, 1996 including specification, claims, drawings and summary is incorporated herein by reference in its entirety.

What is claimed is:

1. A method of fabricating an optical semiconductor device including an optical waveguide having a thickness varying in a lengthwise direction thereof, comprising the steps of:

(a) forming a pair of dielectric masks on a compound semiconductor substrate, said masks including a portion where a width thereof varies in said direction;

(b) epitaxially growing a lower optical confinement layer by metal-organic vapor phase epitaxy (MOVPE) selective growth;

(c) forming a quantum well structure by epitaxially growing a quantum well layer or a plurality of quantum well layers with barrier layers sandwiched between said quantum well layers by metal-organic vapor phase epitaxy (MOVPE) selective growth; and (d) epitaxially growing an upper optical confinement layer by metal-organic vapor phase epitaxy (MOVPE) selective growth, said quantum well layer or plurality of quantum well layers being grown in said step (c) under a growth pressure lower than that of said lower and upper optical confinement layers in said steps (b) and (d).

2. The method as set forth in claim 1, wherein said barrier layers are grown in said step (c) under a growth pressure equal to or greater than that of said quantum well layers.

3. The method as set forth in claim 1, wherein said barrier layers are grown in said step (c) under a pressure equal to or greater than 100 hPa.

4. The method as set forth in claim 3, wherein said barrier layers are grown under a pressure equal to or greater than 200 hPa.

5. The method as set forth in claim 1, wherein said quantum well layer(s) is(are) grown in said step (c) under a growth pressure equal to or smaller than 40 hPa.

6. The method as set forth in claim 5, wherein said quantum well layer(s) is(are) grown under a growth pressure equal to or smaller than 30 hPa.

7. The method as set forth in claim 1, wherein said lower and upper optical confinement layers are grown in said steps (b) and (d) under a growth pressure equal to or greater than 100 hPa.

8. The method as set forth in claim 7, wherein said lower and upper optical confinement layers are grown under a growth pressure equal to or greater than 200 hPa.

9. A method of fabricating an optical semiconductor device including an optical waveguide having a thickness varying in a lengthwise direction thereof, comprising the steps of:

(a) forming a pair of dielectric masks on a compound semiconductor substrate, said masks including a portion where a width thereof varies in said direction;

(b) epitaxially growing a lower optical confinement layer by metal-organic vapor phase epitaxy (MOVPE) selective growth;

(c) forming a quantum well structure by epitaxially growing a quantum well layer or a plurality of quantum well layers with barrier layers sandwiched between said quantum well layers by metal-organic vapor phase epitaxy (MOVPE) selective growth; and (d) epitaxially growing an upper optical confinement layer by metal-organic vapor phase epitaxy (MOVPE) selective growth,
said quantum well layer(s) being grown in said step (c) employing tertiarybutylarsine (TBA) and tertiarybutylphosphine (TBP) having a V/III ratio equal to or greater than 50.

10. The method as set forth in claim 9, wherein said lower and upper optical confinement layers are grown in said steps (b) and (d) employing arsine and phosphine as group V source materials.

11. The method as set forth in claim 9, wherein said lower and upper optical confinement layers are grown in said steps (b) and (d) employing tertiarybutylarsine (TBA) and tertiarybutylphosphine (TBP) having a V/III ratio equal to or smaller than 5.

12. The method as set forth in claim 9, wherein said barrier layers are grown in said step (c) employing arsine and phosphine as group V source materials.

13. The method as set forth in claim 9, wherein said barrier layers are grown in said step (c) employing tertiarybutylarsine (TBA) and tertiarybutylphosphine (TBP) having a V/III ratio equal to or smaller than 5.

14. A method of fabricating an optical semiconductor device including an optical waveguide, comprising the steps of:
(a) forming a pair of dielectric masks on a compound semiconductor substrate, said masks including a portion where a width thereof varies in a lengthwise direction of said optical waveguide;
(b) selectively growing a lower confinement layer by metal-organic vapor phase epitaxy (MOVPE);
(c) selectively growing a quantum well layer or a plurality of quantum well layers with barrier layers sandwiched between said quantum well layers, of a quantum well structure on said compound substrate by MOVPE; and
(d) selectively growing an upper confinement layer by MOVPE;
said step of selectively growing a quantum well layer or a plurality of quantum well layers of said quantum well structure providing a band-gap energy which is constant within ±30 meV in said lengthwise direction, and steps (b), (c) and (d) collectively providing an optical waveguide having a thickness varying in said lengthwise direction to thereby have a function of spot-size conversion.

15. A method of fabricating an optical semiconductor device including an optical waveguide, comprising the steps of:
(a) forming a pair of dielectric masks on a compound semiconductor substrate, said masks including a portion where a width thereof varies in a lengthwise direction of said optical waveguide;
(b) selectively growing a lower confinement layer by metal-organic vapor phase epitaxy (MOVPE);
(c) selectively growing a quantum well layer or a plurality of quantum well layers with barrier layers sandwiched between said quantum well layers, of a quantum well structure on said compound substrate by MOVPE, said quantum well structure having a constant thickness in said lengthwise direction; and
(d) selectively growing an upper confinement layer by MOVPE;
said lower and upper confinement layers selectively growing in steps (b) and (d) to a thickness varying in said lengthwise direction.

16. The method as set forth in claim 15, further comprising the step of growing said lower and upper optical confinement layers to a thickness having a maximum at a center in said lengthwise direction.

17. A method of fabricating an optical semiconductor device including an optical waveguide having a thickness varying in a lengthwise direction thereof, comprising the steps of:
(a) forming a pair of dielectric masks on a compound semiconductor substrate, said masks including a portion where a width thereof varies in said lengthwise direction;
(b) selectively growing a lower confinement layer, forming a lower optical confinement layer having a thickness varying in said lengthwise direction, by metal-organic vapor phase epitaxy (MOVPE);
(c) forming a quantum well structure by epitaxially growing a quantum well layer or a plurality of quantum well layers with barrier layers sandwiched between said quantum well layers by MOVPE, epitaxially growing each quantum well layer with a thickness substantially constant in said lengthwise direction; and
(d) selectively growing an upper confinement layer, forming an upper optical confinement layer having a thickness varying in said lengthwise direction, by MOVPE.

18. The method as set forth in claim 17, further comprising forming said barrier layers with a thickness varying in said lengthwise direction.

* * * * *